United States Patent
Liberatore et al.

(10) Patent No.: US 10,934,457 B2
(45) Date of Patent: Mar. 2, 2021

(54) ALTERING SHEAR THICKENING IN FUMED SILICA SUSPENSIONS USING NANOPARTICLES

(71) Applicant: The University of Toledo, Toledo, OH (US)

(72) Inventors: Matthew Liberatore, Toledo, OH (US); Ehsan Akbari Fakhrabadi, Toledo, OH (US)

(73) Assignee: The University of Toledo, Toledo, OH (US)

(*) Notice: Subject to any disclaimer, the term of this patent is extended or adjusted under 35 U.S.C. 154(b) by 0 days.

(21) Appl. No.: 16/417,895

(22) Filed: May 21, 2019

(65) Prior Publication Data

US 2019/0359855 A1   Nov. 28, 2019

Related U.S. Application Data

(60) Provisional application No. 62/675,405, filed on May 23, 2018.

(51) Int. Cl.
| | |
|---|---|
| *C09G 1/02* | (2006.01) |
| *C09K 3/14* | (2006.01) |
| *H01L 21/306* | (2006.01) |
| *H01L 21/3105* | (2006.01) |

(52) U.S. Cl.
CPC ............ *C09G 1/02* (2013.01); *C09K 3/1454* (2013.01); *C09K 3/1463* (2013.01); *H01L 21/30625* (2013.01); *C09K 3/1409* (2013.01)

(58) Field of Classification Search
None
See application file for complete search history.

(56) References Cited

U.S. PATENT DOCUMENTS

| | | | | |
|---|---|---|---|---|
| 6,218,305 B1* | 4/2001 | Hosali | ............ | C03C 19/00 216/88 |
| 8,114,178 B2* | 2/2012 | Izumi | ............ | B24B 37/044 106/3 |
| 2017/0275498 A1* | 9/2017 | Tamada | ............ | C09K 3/1409 |

FOREIGN PATENT DOCUMENTS

WO    2016/052408    * 4/2016

* cited by examiner

*Primary Examiner* — Stephanie P Duclair
(74) *Attorney, Agent, or Firm* — MacMillan, Sobanski & Todd, LLC

(57) ABSTRACT

Slurry compositions useable in chemical mechanical polishing processes, as well as methods of making and methods of using the same, are described.

26 Claims, 27 Drawing Sheets
(24 of 27 Drawing Sheet(s) Filed in Color)

ALTERING SHEAR THICKENING IN FUMED SILICA SUSPENSIONS USING NANOPARTICLES

RELATED APPLICATIONS

This application claims priority to U.S. Provisional Application No. 62/675,405 filed under 35 U.S.C. § 111(b) on May 23, 2018, the disclosure of which is incorporated herein by reference in its entirety.

STATEMENT REGARDING FEDERALLY SPONSORED RESEARCH

This invention was made with no government support. The government has no rights in this invention.

BACKGROUND

Semiconductor manufacturing is an essential technology for the United States' competitiveness in the global economy. To meet the ever growing demand for more sophisticated electronic devices, the semiconductor industry must continually reduce feature sizes in order to produce faster and more powerful microprocessors. Today's most advanced silicon chips contain over one billion transistors in one square centimeter of surface area. In order to interconnect such a large number of electrical elements, materials must be planarized with nanometer-scale precision while leaving the newly exposed surface free of defects, such as scratches, gouges, or pits. Currently, chemical mechanical polishing (CMP) is the only technique that can handle such a demanding task.

CMP is a critical processing technology used by the semiconductor industry to produce a wide variety of materials, including logic devices, memory chips, and microelectronic machines (MEMs). The CMP process depends on the ability to produce colloidally-stable dispersions for abrasion and to transport the waste products away from the polished surface. The development of faster chips with smaller, more delicate features has led CMP slurry manufacturers to de-emphasize the mechanical component of CMP, instead favoring more chemically active slurries, which has led to problems with corrosion and etching.

Particulate slurries are used in CMP as the abrasive agent to remove excess material from the semiconducting wafers. During the CMP process, shearing the slurries sandwiched in between two plates (a polymeric pad as the top and the dielectric wafer as the bottom plate) ensures removing scratches from the surface leaving a uniform interconnected multilayer Integrated Circuit (IC). The abrasive nature of fumed silica particles along with their cheap price and abundancy in earth crust makes them commonly used for CMP applications. However, studies have shown that under the extreme conditions (intensive shear rates) of CMP, individual fumed silica particles tend to interact and collide, forming larger agglomerates and causing a spike in viscosity at a Critical Shear Rate (CSR). Furthermore, the potential of shear induced agglomerates formed in the CMP process has been linked to defects formed on the wafer surface during a high shear experimental process.

When initially adopted in the mid 1990s, CMP was primarily used for flattening the surface of a silicon dioxide wafer to allow precise photolithography of fine features for subsequent processing steps. The semiconductor industry rapidly learned that CMP was also beneficial for removing overburden from metallization steps. Today, CMP technology is widely used to polish silicon dioxide, copper, tantalum, tantalum nitride, aluminum and tungsten, with application to many other materials being considered by semiconductor development scientists and engineers. The direct cost of CMP related defects is estimated to be billions of dollars of lost production per year.

There is a need in the art for new and improved slurry compositions and methods for CMP. Advanced processing technologies are needed to improve computer chips, flat panel displays, solar cells, paper, ceramics, sports equipment, and pharmaceuticals, and to reduce the incidence of defects during polishing.

SUMMARY

Provided is a composition comprising a slurry comprising fumed silica particles in a solvent; spherical silica particles in the slurry; and a monovalent salt in the slurry at a concentration ranging from about 0.01 M to about 0.4 M. In certain embodiments, the monovalent salt has a concentration ranging from about 0.02 M to about 0.25 M. In certain embodiments, the monovalent salt has a concentration ranging from about 0.1 M to about 0.2 M. In certain embodiments, the monovalent salt has a concentration ranging from about 0.12 M to about 0.18 M.

In certain embodiments, the composition has a total solids content ranging from about 0.01 wt % to about 40 wt %. In certain embodiments, the composition has a total solids content ranging from about 15 wt % to about 30 wt %. In certain embodiments, the composition has a total solids content ranging from about 22 wt % to about 25 wt %. In certain embodiments, the fumed silica particles and the spherical silica particles are present a fumed:spherical wt % ratio ranging from about 18:7 to about 25:1.

In certain embodiments, the composition further comprises one or more additives selected from the group consisting of such as coagulants, emulsifiers, corrosion inhibitors, oxidizers, surfactants, chelating agents, and pH buffers. In certain embodiments, the composition further comprises a stabilizer.

In certain embodiments, the monovalent salt has a concentration of about 0.12 M. In certain embodiments, the monovalent salt has a concentration of about 0.18 M. In certain embodiments, the spherical silica particles have a diameter ranging from about 10 nm to about 170 nm. In certain embodiments, the spherical silica particles have a diameter of about 12 nm. In certain embodiments, the spherica silica particles have a diameter of about 112 nm. In certain embodiments, the fumed silica particles have a diameter ranging from about 100 nm to about 250 nm.

In certain embodiments, the fumed silica has a concentration ranging from about 5 wt % to about 35 wt %. In certain embodiments, the fumed silica has a concentration ranging from about 20 wt % to about 25 wt %. In certain embodiments, the spherical silica has a concentration ranging from about 0.001 wt % to about 10 wt %.

In certain embodiments, the composition is prepared by contacting the slurry with a parent salt solution having a salt concentration ranging from about 0.15 M to about 3 M. In particular embodiments, the parent salt solution has a salt concentration ranging from about 0.3 M to about 1 M. In particular embodiments, the parent salt solution has a salt concentration of about 0.3 M, the spherical silica particles have a diameter of about 112 nm, the composition has a monovelant salt concentration of about 0.12 M, and the fumed silica particles and the spherical silica particles are present in a fumed:spherical wt % ratio ranging of about 24:1. In particular embodiments, the parent salt solution has a salt concentration of about 0.3 M, the spherical silica particles have a diameter of about 112 nm, the composition has a monovelant salt concentration of about 0.12 M, and the fumed silica particles and the spherical silica particles are present in a fumed:spherical wt % ratio ranging of about 23:2. In particular embodiments, the parent salt solution has a salt concentration of about 1 M, the spherical silica particles have a diameter of about 112 nm, the composition has a monovelant salt concentration of about 0.12 M, and the fumed silica particles and the spherical silica particles are present in a fumed:spherical wt % ratio ranging of about 24:1. In particular embodiments, the parent salt solution has a salt concentration of about 1 M, the spherical silica particles have a diameter of about 112 nm, the composition has a monovelant salt concentration of about 0.12 M, and the fumed silica particles and the spherical silica particles are present in a fumed:spherical wt % ratio ranging of about 23:2.

In certain embodiments, the spherical particles have a diameter of about 12 nm, the monovalent salt has a concentration of about 0.12 M, and the fumed silica particles and the spherical silica particles are present a fumed:spherical wt % ratio of about 18.75:6.25.

In certain embodiments, the spherical particles have a diameter of about 12 nm, the monovalent salt has a concentration of about 0.12 M, and the fumed silica particles and the spherical silica particles are present a fumed:spherical wt % ratio of about 21.25:3.75.

In certain embodiments, the spherical particles have a diameter of about 12 nm, the monovalent salt has a concentration of about 0.12 M, and the fumed silica particles and the spherical silica particles are present a fumed:spherical wt % ratio of about 22.5:2.5.

In certain embodiments, the spherical particles have a diameter of about 12 nm, the monovalent salt has a concentration of about 0.12 M, and the fumed silica particles and the spherical silica particles are present a fumed:spherical wt % ratio of about 23.75:1.25.

In certain embodiments, the spherical particles have a diameter of about 12 nm, the monovalent salt has a concentration of about 0.12 M, and the fumed silica particles and the spherical silica particles are present a fumed:spherical wt % ratio of about 24.5:0.5.

In certain embodiments, the spherical particles have a diameter of about 12 nm, the monovalent salt has a concentration of about 0.12 M, and the fumed silica particles and the spherical silica particles are present a fumed:spherical wt % ratio of about 25:2.

In certain embodiments, the spherical particles have a diameter of about 12 nm, the monovalent salt has a concentration of about 0.12 M, and the fumed silica particles and the spherical silica particles are present a fumed:spherical wt % ratio of about 25:1.5.

In certain embodiments, the spherical particles have a diameter of about 12 nm, the monovalent salt has a concentration of about 0.12 M, and the fumed silica particles and the spherical silica particles are present a fumed:spherical wt % ratio of about 25:1.

In certain embodiments, the spherical particles have a diameter of about 112 nm, the monovalent salt has a concentration of about 0.12 M, and the fumed silica particles and the spherical silica particles are present a fumed:spherical wt % ratio of about 19:3.

In certain embodiments, the spherical particles have a diameter of about 112 nm, the monovalent salt has a concentration of about 0.12 M, and the fumed silica particles and the spherical silica particles are present a fumed:spherical wt % ratio of about 20:2.

In certain embodiments, the spherical particles have a diameter of about 112 nm, the monovalent salt has a concentration of about 0.12 M, and the fumed silica particles and the spherical silica particles are present a fumed:spherical wt % ratio of about 21:1.

In certain embodiments, the spherical particles have a diameter of about 110 nm, the monovalent salt has a concentration of about 0.12 M, and the fumed silica particles and the spherical silica particles are present a fumed:spherical wt % ratio of about 20:2.

In certain embodiments, the spherical particles have a diameter of about 110 nm, the monovalent salt has a concentration of about 0.12 M, and the fumed silica particles and the spherical silica particles are present a fumed:spherical wt % ratio of about 21:1.

In certain embodiments, the spherical particles have a diameter of about 120 nm, the monovalent salt has a concentration of about 0.12 M, and the fumed silica particles and the spherical silica particles are present a fumed:spherical wt % ratio of about 20:2.

In certain embodiments, the spherical particles have a diameter of about 120 nm, the monovalent salt has a concentration of about 0.12 M, and the fumed silica particles and the spherical silica particles are present a fumed:spherical wt % ratio of about 21:1.

In certain embodiments, the solvent is water. In certain embodiments, the solvent has a viscosity of about 1 cP at 25° C.

In certain embodiments, the composition comprises fumed silica particles having a size ranging from 100-250 nm at a concentration ranging from about 5 wt % to about 35 wt %, spherical silica particles having a size ranging from about 10 nm to about 150 nm at a concentration ranging from 0-10 wt %, wherein the solvent is water.

In certain embodiments, the fumed silica and the spherical silica are present a fumed:spherical wt % ratio of from about 24:1 to about 23:2.

Further provided is a method of altering shear thickening of a fumed silica suspension, the method comprising adding spherical silica particles having a size ranging from about 10 nm to about 170 nm to the fumed silica suspension, and further adding a monovalent salt to the fumed silica suspension by contacting the fumed silica suspension with a parent salt solution having a monovalent salt concentration of from about 0.15 M to about 3 M.

In certain embodiments, the fumed silica comprises particles having a diameter ranging from about 100 nm to about 250 nm. In certain embodiments, the method further comprises adjusting the concentration of the monovalent salt in the fumed silica suspension. In certain embodiments, the monovalent salt is a chloride.

In certain embodiments, the monovalent salt is added to obtain a final salt concentration ranging from about 0.02 M to about 0.25 M. In certain embodiments, the monovalent salt is added to obtain a final salt concentration ranging from about 0.1 M to about 0.2 M. In certain embodiments, the monovalent salt is added to obtain a final salt concentration ranging from about 0.12 M to about 0.18 M. In certain embodiments, the monovalent salt is added to obtain a final salt concentration of about 0.12 M. In certain embodiments, the fumed silica suspension becomes less viscous at increasing shear rates with the addition of the spherical silica particles.

Further provided is a method of chemical mechanical polishing, the method comprising polishing a semiconductor wafer with a slurry composition, wherein the slurry composition comprises fumed silica particles having a size ranging from about 100 nm to about 250 nm, spherical silica particles having a size ranging from about 10 nm to about 170 nm, and a monovalent salt at a concentration ranging from about about 0.01 M to about 0.4 M. In certain embodiments, the slurry composition is prepared by contacting the slurry with a parent salt solution having a salt concentration ranging from about 0.15 M to about 3 M. In certain embodiments, monovalent salt has a concentration ranging from about 0.02 M to about 0.25 M. In certain embodiments, monovalent salt has a concentration ranging from about 0.1 M to about 0.2 M. In certain embodiments, monovalent salt has a concentration ranging from about 0.12 M to about 0.18 M.

Further provided is a kit for preparing a chemical mechanical polishing slurry, the kit comprising a first container housing fumed silica particles or spherical silica particles; a second container housing a solvent; and a third container housing a monovalent salt solution having a concentration ranging from about 0.15 M to about 3 M.

BRIEF DESCRIPTION OF THE DRAWINGS

The patent or application file may contain one or more drawings executed in color and/or one or more photographs. Copies of this patent or patent application publication with color drawing(s) and/or photograph(s) will be provided by the U.S. Patent and Trademark Office upon request and payment of the necessary fees.

FIGS. 3A-3B show that scratching intensifies with thickening.

FIG. 23A is a graph of viscosity versus shear rate of a fumed silica slurry with spherical silica particles and NaCl added at 1.0 M concentration. FIG. 23B is a graph of viscosity versus shear rate of a fumed silica slurry with spherical silica particles and NaCl added at 0.3 M concentration. For both, the slurries were 25 wt % total silica, the spherical particles had an average diameter of 112 nm, and the final salt concentration was 0.12 M NaCl. The graphs show the wt % ratio of fumed:spherical for the slurries evaluated.

DETAILED DESCRIPTION

Throughout this disclosure, various publications, patents, and published patent specifications are referenced by an identifying citation. The disclosures of these publications, patents, and published patent specifications are hereby incorporated by reference into the present disclosure in their entirety to more fully describe the state of the art to which this invention pertains.

Figure 5:
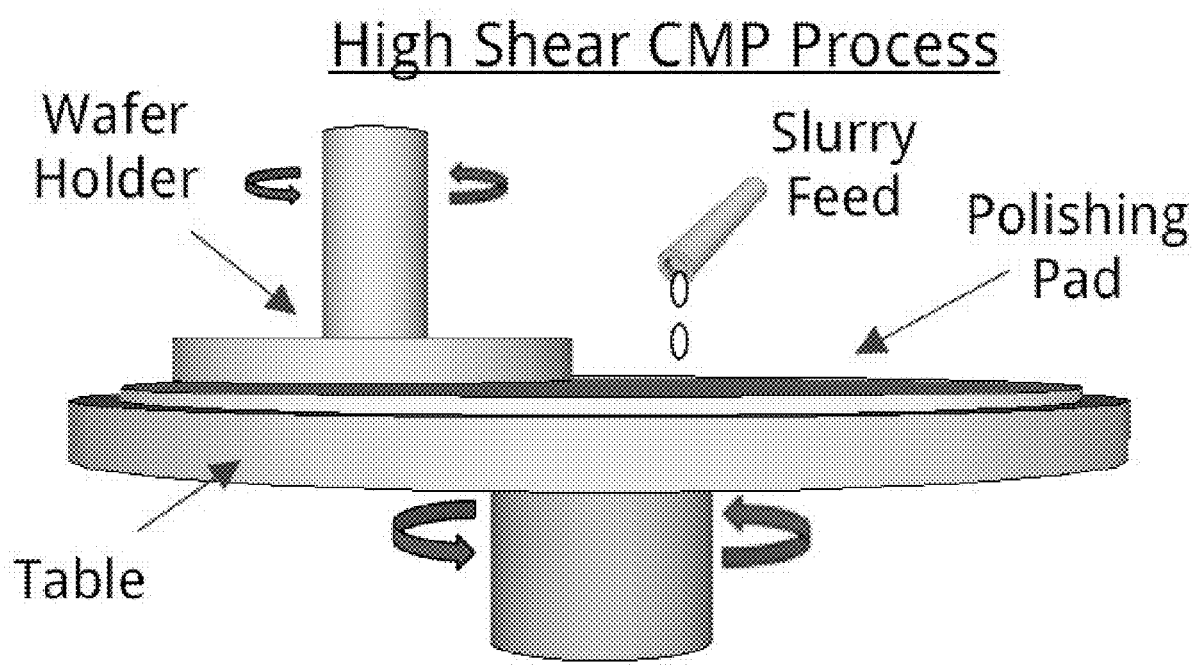
FIG. 5: Schematic of chemical mechanical polishing.

In a typical CMP process, the surface to be polished is placed in direct contact with a rotating polishing pad (FIG. 5). A robotic carrier applies pressure against the backside of the wafer. During the polishing process, the pad and table are rotated while a downward force is maintained against the substrate back. An abrasive solution, commonly referred to as a slurry, is dispensed onto the pad surface during polishing. The slurry initiates the polishing process by chemically reacting with the film being polished. The polishing process is facilitated by the rotational movement of the pad relative to the substrate as slurry is delivered to the wafer/pad interface.

Figure 4:
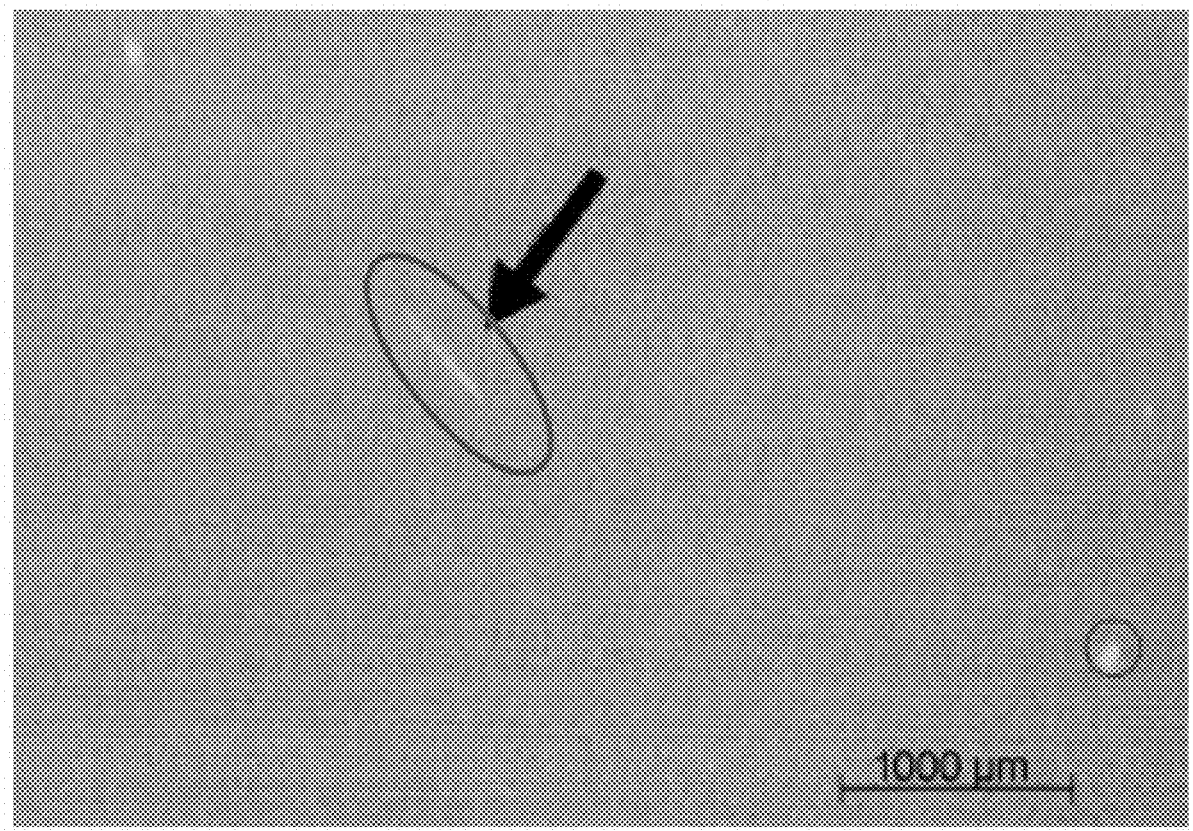
FIG. 4: Scanning electron micrograph with a CMP induced scratch. The scratch is ~1000 µm long compared to <50 nm for the semicondcutor's feature size.

A trend in the semiconductor industry is the rapidly decreasing size and increasing density of the semiconductor features. Smaller sizes (<50 nm) and smaller separations place ever more stringent demands on the photolithography process, which in turn places ever more stringent demands on the flatness of the semiconductor wafer surface and the absence of defects such as scratches, gouges, pits, and corrosion (FIG. 4). Coupled with the complexity of multiple surfaces and decreasing feature size, manufacturers are under severe price pressure for the finished semiconductor device. This forces the manufacturers to place high value on both production rate and final yield. Production rate and defectivity can be severely impacted by the CMP steps required, particularly for some of the harder and more noble metal substrates. The industry has responded in many ways, including introducing larger wafers to minimize edge losses and new slurries.

Modern trends in slurry design often rely upon a mix of electrostatic and steric, or electro-steric, forces to provide stability. However, balancing these forces comes at the cost of an increase in chemical complexity in both manufacturing and use. Another trend in modern CMP slurry development is to rely on more chemically active slurries with less mechanical abrasion. This permits the use of lower solids fractions and smaller particles, but often at the cost of lower removal rates (and therefore reduced throughput) and higher risk of corrosion and other forms of unwanted chemical attack. Thus, a superior colloidal stabilization mechanism can open up the design space for CMP slurries, to allow formulators to choose the degree of chemical and mechanical action most suitable to the problem at hand.

One mechanism of colloidal stabilization involves large "microparticles" of one material composition mixed with smaller "nanoparticles" of a different chemical composition. Beneficial for this mechanism of stabilization is the manipulation of the pH such that the nanoparticles are highly charged, while the microparticles are weakly charged or uncharged, ideally with the same polarity. The effect has been shown to be effective for a variety of material pairs, including silica/zirconia, alumina/ceria, polystyrene/zirconia, and silica/polystyrene. The size ratio was initially expected to need to be large, but even a modest multiple of large:small can result in effective stabilization. While this has been shown with very dilute dispersions, the effect has been demonstrated at particle concentrations relevant to CMP, specifically up to 45% volume fraction. In high solids systems, a "phase transition" has been observed where a gel-like phase transitions to a fluid phase and back to a gel. At modest shear rates (<1000 $s^{-1}$), the gel phase of these dispersions displays shear thinning and finite elastic modulus, while the fluid phase displays an approximately constant viscosity and a near-zero elastic modulus. Little is known about the high shear rheology of these systems. It is known that the addition of up to 40% fine fly ash reduced the viscosity of the mortar and increased the critical shear rate for the onset of shear thickening by more than an order of magnitude. In a similar vein, fine particles of silica and titania were effective at shifting the onset of shear thickening to higher shear rates and in reducing its severity. These systems are much more complex than the model systems typically studied, but provide "real world" evidence of the potential applications including recent work related to CMP, but not rheology. Therefore, the balancing of attractive van der Waals forces with stabilizing Coulombic repulsion to create stable 'halos' may have the ability to increase the shelf life of CMP slurries, alter the shear thickening, and minimize defects during polishing.

Figure 2A:
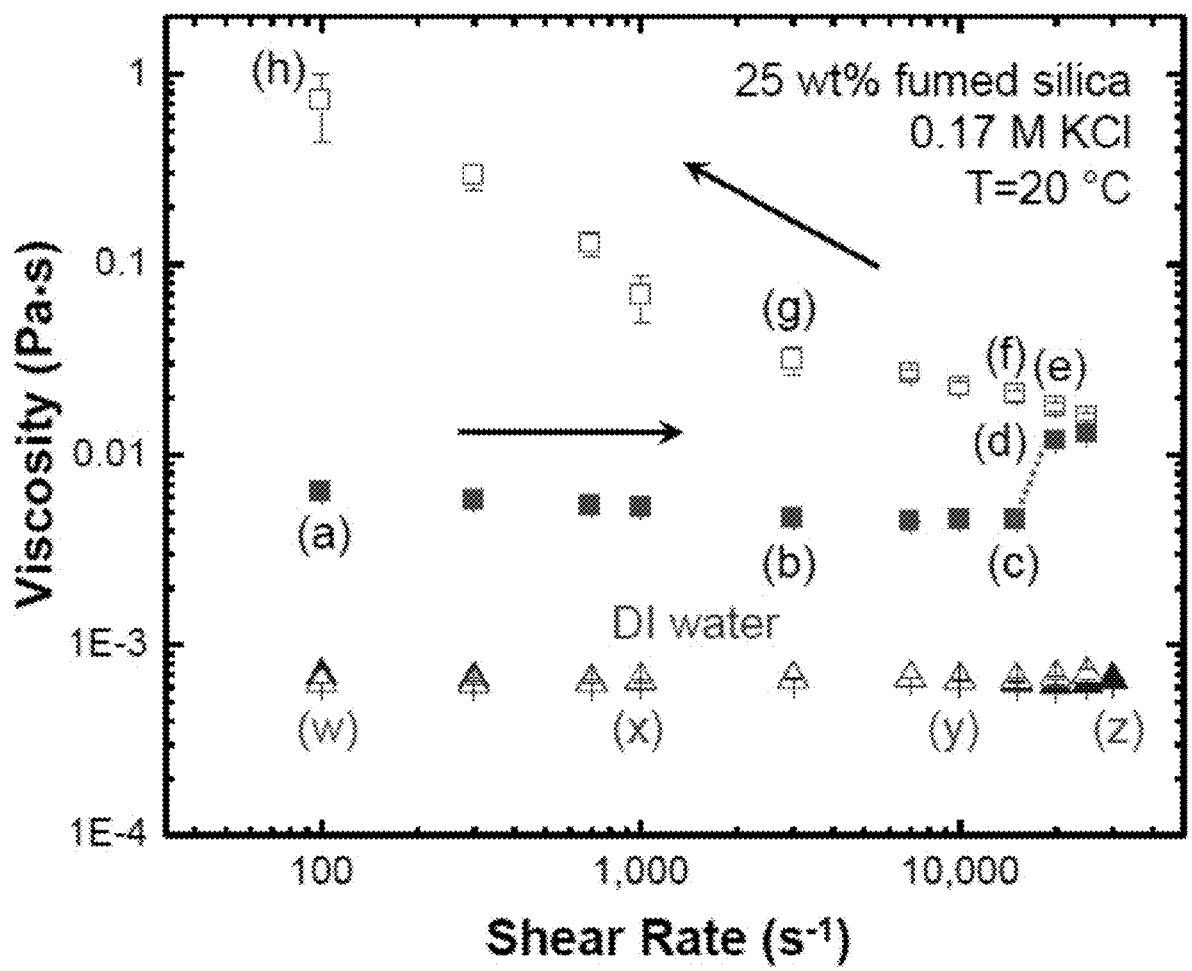
FIGS. 2A-2B: Stepped shear rate ramp (filled symbols) and reduction (open symbols) for DI water (triangles) and a 25 wt % silica slurry with a concentration of added KCl, CKCL, of 0.17 M (squares) (FIG. 2A), and small-angle light scattering images as a function of increasing shear rate (a-d) and decreasing shear rate (e-f) for the 25 wt % silica slurry (CKCl=0.17 M) (FIG. 2B). Letters (a) to (h) and (w) to (z) correspond to the locations of the reported SALS images for the slurry and water samples, respectively. Scattering patterns for the DI water control are shown in images (w) to (z). The flow direction is from left to right in all images.
Figure 2B:
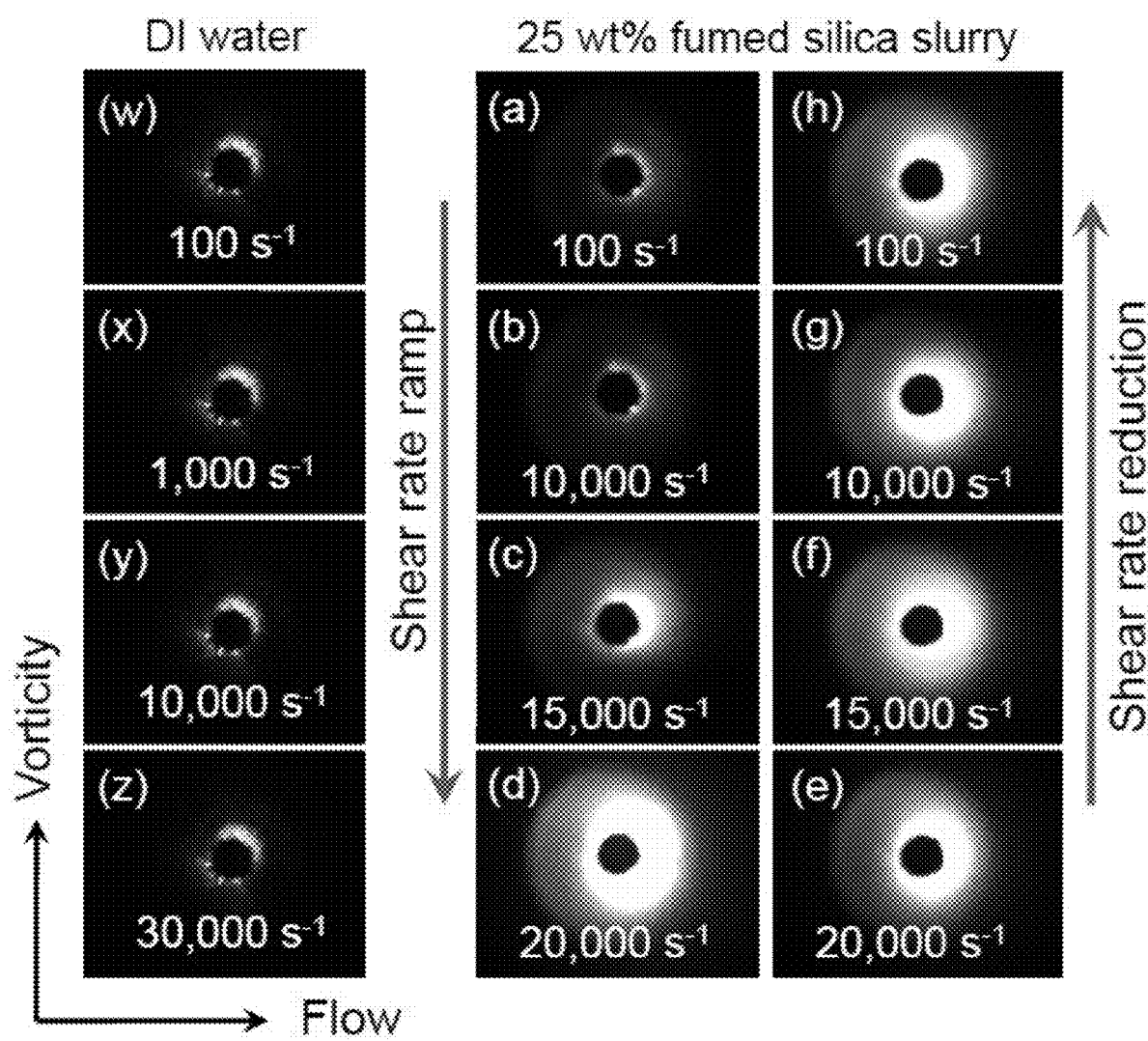

Without wishing to be bound by theory, it is believed that most CMP systems undergo a transition at high shear rates to form hydroclusters. Hydroclusters can be thought of as weakly associated clusters of particles, which arise in response to shear forces. One of the key properties of hydroclusters is that they are formed reversibly, and spontaneously dissipate upon cessation of shear. High solids fumed silica based CMP slurries have demonstrated irreversible shear thickening accompanied by the formation of persistent "large" agglomerates which do not re-disperse readily, as shown in FIGS. 2A-2B. Shear thickening was accompanied by optical detection of large agglomerates and increased defectivity. This combination of evidence indicates that the shear thickening observed in these slurries follows a more primitive aggregation mechanism than hydrocluster formation. Shear thickening fluids generally have different concentrations, shear rates, and reversibility compared to fumed silica CMP slurries.

Figure 9:
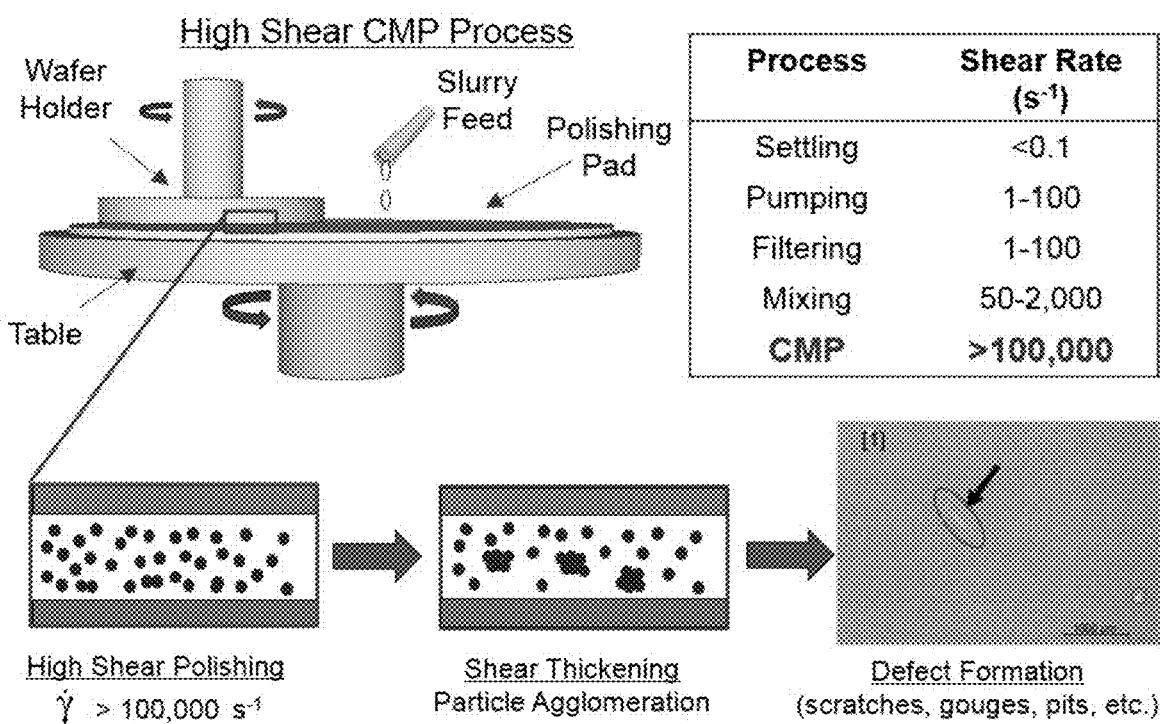
FIG. 9: Illustration showing that shear thickening causes defects.

The semiconductor industry relies on CMP as a core technology in producing smaller and smaller features—currently on the order of 10 nm. Traditional charge stabilized CMP slurries are known to shear thicken at the very high shear rates (>10,000 $s^{-1}$) experienced during polishing, causing defects (FIG. 9). Provided herein are slurry compositions that may substantially eliminate shear thickening and thus minimize defects. Using additives, CMP producers try to push the thickening shear rate out of their processing range while maintaining a consistent material removal rate. Provided herein is a method of shifting the CSR of aqueous fumed silica slurries by adding spherical silica particles of various concentrations. Also, the change in CSR of mixtures can be controlled to go to higher or lower values than pure fumed using two different methods of mixing.

General Description

In accordance with the present disclosure, dispersions stabilized by nanoparticles provide a mechanism to eliminate shear thickening and shear-induced structuring under high shear conditions. Adding ~10-170 nm spherical silica particles to fumed silica suspensions can shift or eliminate shear thickening. Furthermore, the addition of salt, such as NaCl or other inorganic salt, can reverse the effect under certain circumstances; upon addition of salt from a parent salt solution having a higher salt concentration, the addition of more spherical silica particles can result in an increased viscosity of the slurry and the addition of less spherical silica particles at high salt concentration can result in less viscosity of the slurry. Thus, in accordance with the present disclosure, slurries can be made with precisely tailored thickening characteristics by adjusting the amount of spherical silica particles added and the concentration of the salt solution used to bring the slurry to its final salt concentration.

Figure 23A:
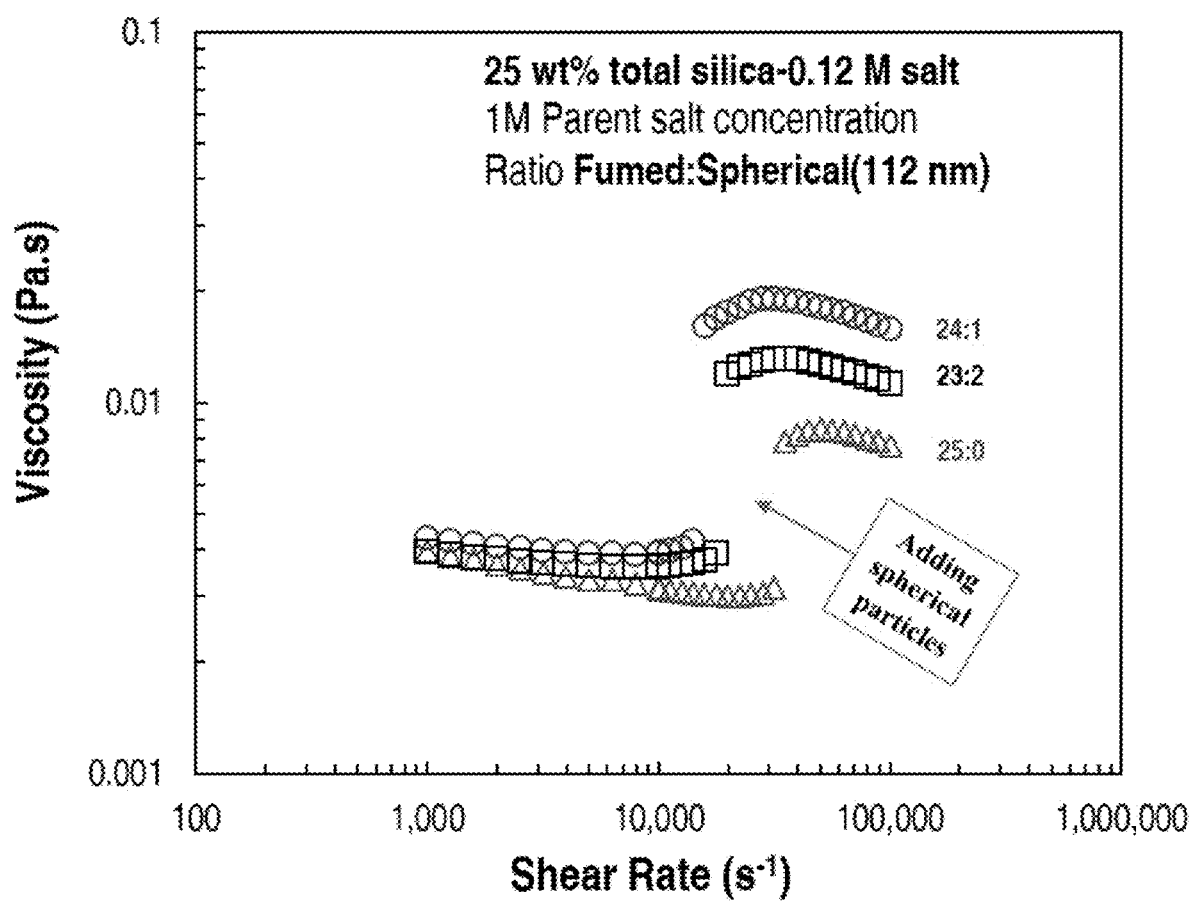
FIGS. 23A-23B: Graphs showing that parent salt concentration alters thickening.
Figure 23B:
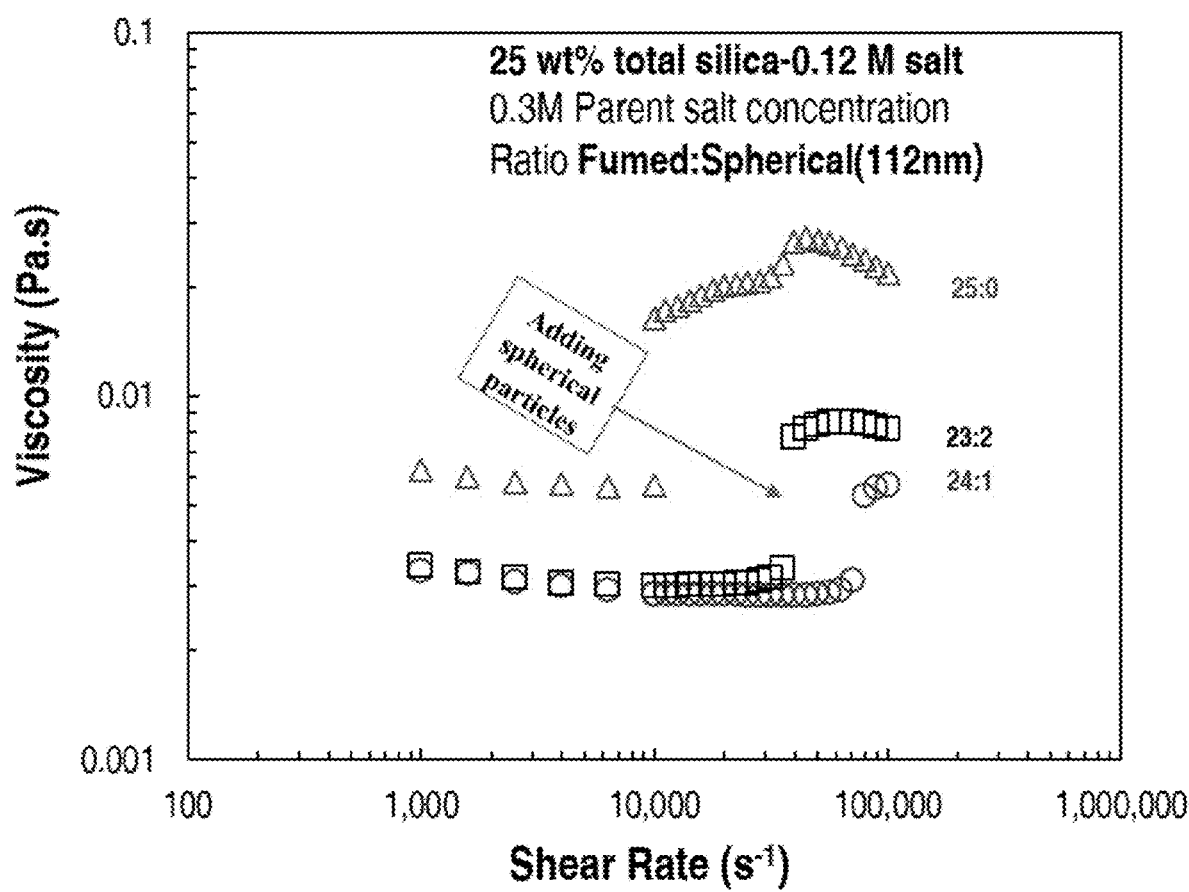

To describe one non-limiting example slurry composition, while maintaining a total solid content at 25 wt %, adding spherical silica particles of 100 nm at a final NaCl concentration of 0.12 M is able to alter the CSR, as seen in FIGS. 23A-23B. In addition, despite the fact that the final samples in FIGS. 23A-23B have the same final concentrations, two different results have been engineered, unexpectedly. Parent slurries in FIG. 23A were exposed to a higher ion concentration at the time of preparation (adding NaCl 1 M solution) compared to the parent slurries in FIG. 23B (adding 0.3 M NaCl solution). Introducing higher ion concentration to electrostatically stable dispersions of pH adjusted charged particles can create a ion screening effects, which lead to lower stability of the silica slurries. The underlying reason for different trends of altering CSR for the two sets of samples is unknown at this time. It is not clear why different salt-adding methods can affect the rheological behavior of fumed/spherical silica mixture slurries.

In general, the slurry compositions described herein comprise fumed silica particles and spherical silica particles in a slurry with a solvent, where the slurry further includes a monovalent salt. In some embodiments, the solvent is water, and the slurry composition includes fumed silica particles, water, spherical silica particles, and a monovalent salt. The monovalent salt can be, for example, NaCl, KCl, or LiCl, and may be present at a final concentration in the slurry composition of from about 0.01 M to about 0.4 M, or from about 0.02 M to about 0.25 M, or from about 0.1 M to about 0.2 M, or from about 0.12 M to about 0.18 M. Such a composition alters the critical shear rate and the degree of thickening.

Figure 6:
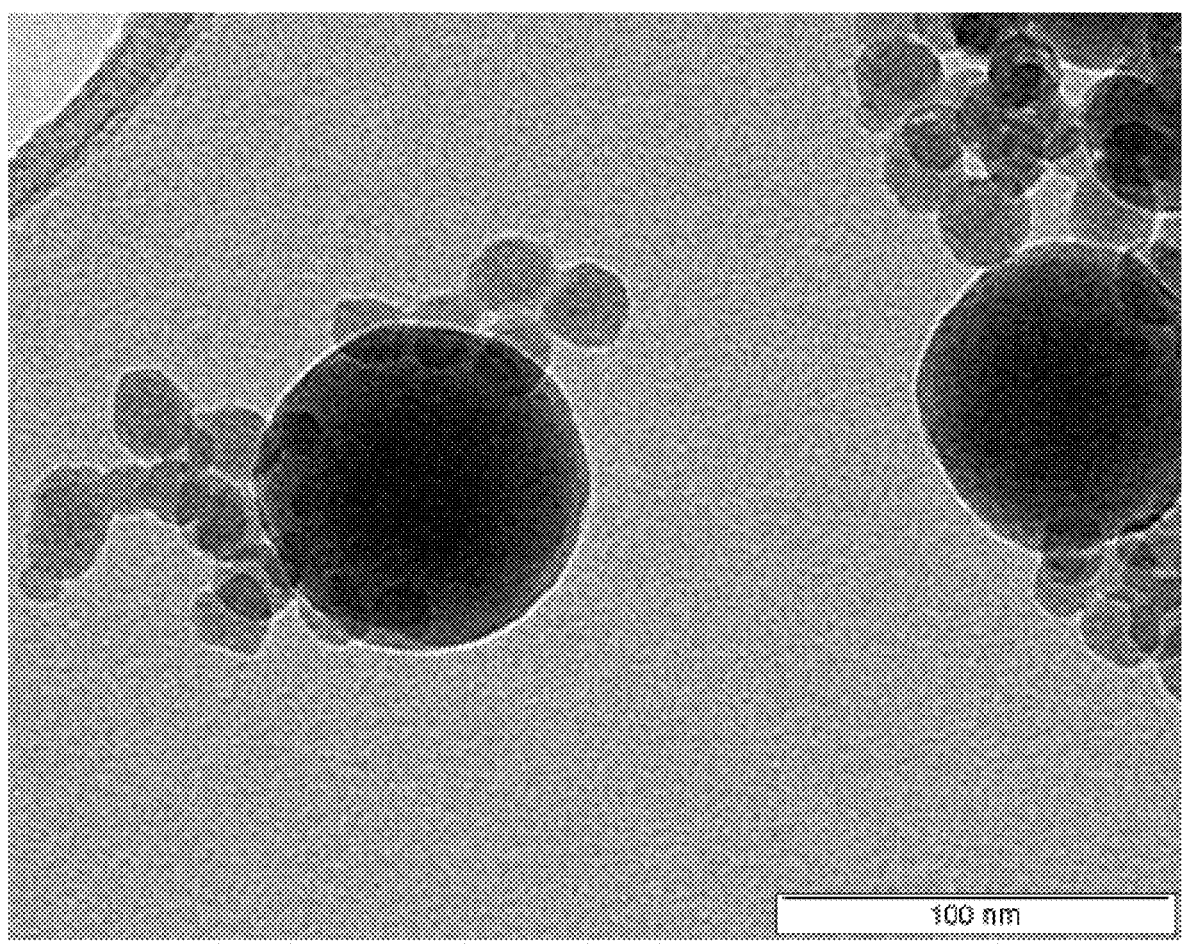
FIG. 6: Electron micrograph of silica-silica bimodal particles dried on a grid.

Spherical silica particles are silica particles which are substantially spherical in shape, such as those seen in FIG. 6. Spherical silica particles produced by, for example, the Stöber process are readily available in a wide variety of sizes. The slurry compositions herein may include spherical silica particles having a size ranging from about 10 nm to about 170 nm, and at a concentration of from about 0.01 wt % to about 10 wt %.

Figure 10:
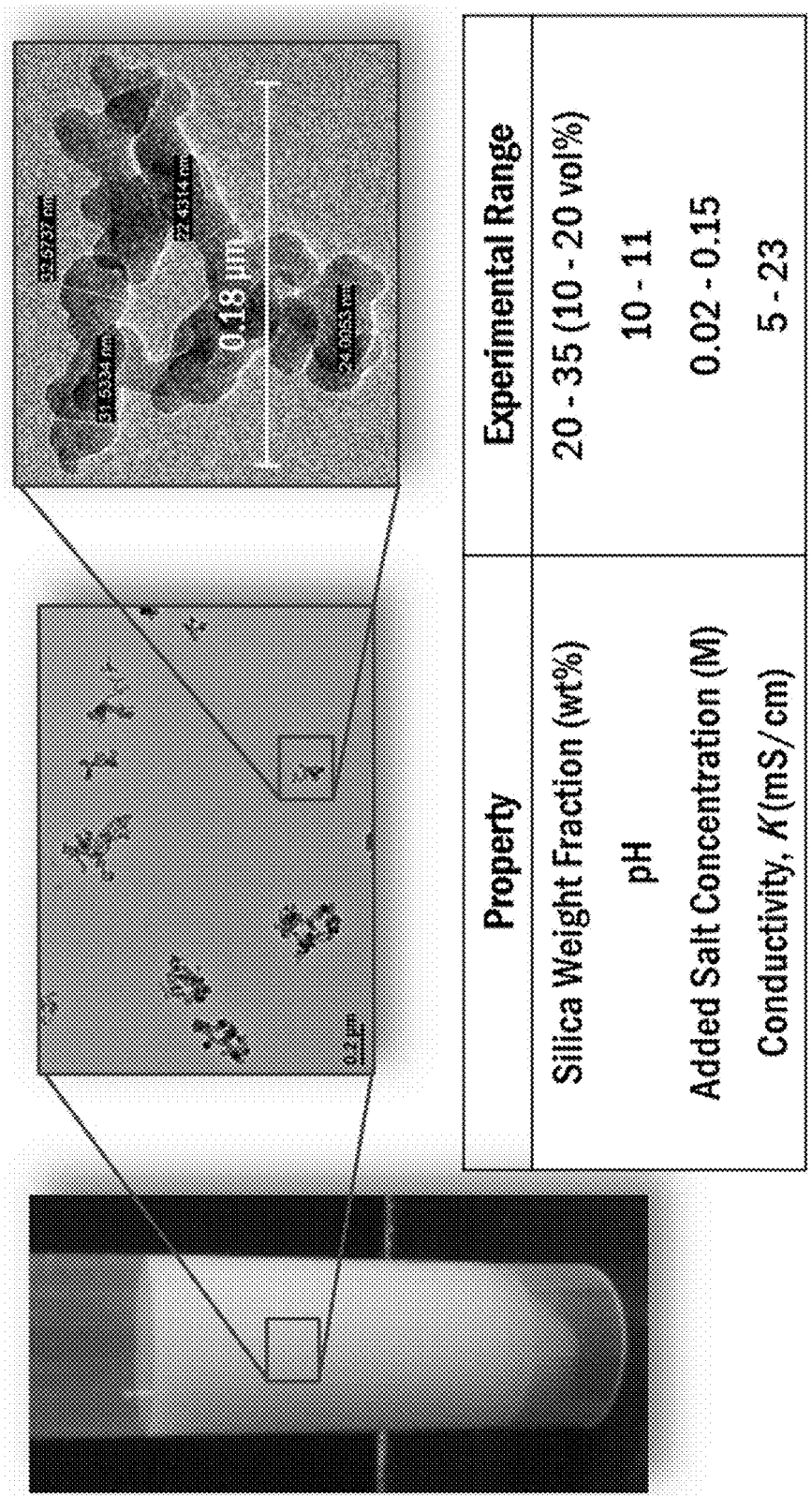
FIG. 10: Fumed silica suspension composed of fumed silica (~0.2 µm diameter) in water and KOH for electrostatic stabilization.

Fumed silica particles tend to polish better than spherical silica particles. Thus, it is advantageous to retain fumed silica particles in CMP slurries. Fumed silica particles are also commercially available. The slurry compositions herein may include fumed silica particles having a size ranging from about 100 nm to about 250 nm, and at a concentration ranging from about 5 wt % to about 35 wt %. FIG. 10 shows a fumed silica suspension composed of fumed silica (~0.2 μm diameter) in water and KOH for electrostatic stabilization. The image on the left shows the visual appearance of the slurry. The image on the right in FIG. 10 shows a fumed silica particle having a diameter of about 180 nm. As seen from this image, fumed silica particles do not have a substantially spherical shape like spherical silica particles do.

The wt % ratio of fumed:spherical silica particles in the slurry composition may range from about 18:7 to about 25:1. In some non-limiting examples, the wt % ratio of fumed:spherical silica particles is about 23:2, about 24.5:0.5, about 25:1.5, about 23.75:1.25, or about 20:2. However, many other ratios are possible and are entirely encompassed within the present disclosure.

In one non-limiting example, a slurry composition comprises fumed silica particles having a size ranging from 100-250 nm at a concentration of about 5-35 wt %, spherical silica particles having a size ranging from 10-170 nm at a concentration ranging from 0.01-10 wt %, water, and NaCl at a final salt concentration of about 0.12 M, where the composition has a solvent viscosity of about 1 cP at 25° C.

Figure 18:
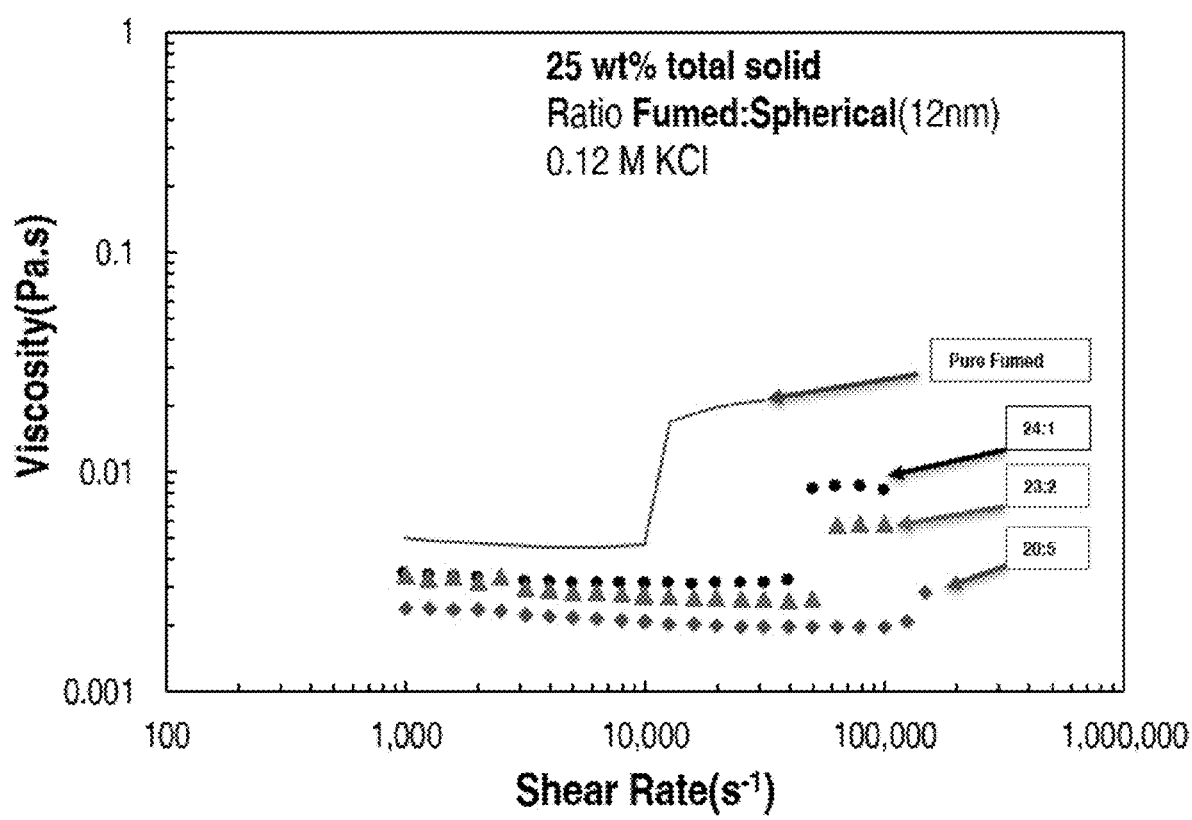
FIG. 18: Graph showing that mixing fumed and spherical silica particles alters thickening. KCl was used as the salt. The graph shows the viscosity as a function of shear rate for several slurries with varying fumed:spherical ratios, each having 25 wt % total solids content, 12 nm spherical silica particles, and a salt concentration of 0.12 M KCl. A pure fumed silica slurry is also shown for comparison.

Surprisingly, adding more solids can reduce the thickening of the slurry at high shear rates. As seen in FIG. 18, a slurry composition having 25 wt % fumed silica particles, 12 nm spherical silica particles, and a final salt concentration of 0.12 M has less thickening at higher shear rates upon the addition of more spherical particles. This is not an intuitive result because one would expect an increase in solids content to result in an increase in viscosity of the composition, due to increased formation of agglomerates.

Furthermore, salt shifts the window where the thickening occurs, and can be used to reduce thickening at high shear rates. In general, the slurry compositions described herein include a monovalent salt at a final concentration ranging from about 0.1 M to about 0.2 M, or from about 0.12 M to about 0.18 M.

In one non-limiting example, the slurry composition has a final salt concentration of 0.12 M, and is made by spiking a slurry of fumed and spherical silica particles with a salt solution having a salt concentration of 1 M. Surprisingly, this slurry composition demonstrates different thickening behavior at high shear rates compared to an otherwise identical slurry composition, still having a final salt concentration of 0.12 M, but which is made by spiking a slurry of fumed and spherical silica particles with a salt solution having a salt concentration of 0.3 M. This effect is shown in FIGS. 23A-23B. It is not currently known why this occurs when both slurries have the same final salt concentration.

As noted, the fumed silica particles may have a size ranging from about 100 nm to about 250 nm, and the spherical silica particles may have a size ranging from about 10 nm to about 170 nm. As seen by comparing FIG. 18 to FIG. 23B, the use of 12 nm spherical silica particles results in a lower viscosity at higher shear rates compared to the use of 112 nm spherical silica particles. Without wishing to be bound by theory, it is believed that the ratio of the size of the particles is likely important because of the surface area charge. Fumed silica particles are charged. Electrostatic interactions drive the thickening. Particle characterization of individual components and mixtures may involve a suite of particle size and zeta potential tools, as appropriate for the particle size in question, such as, but not limited to, static light scattering, acoustic attenuation, and disk centrifugation for microparticles; and dynamic light scattering, capillary hydrodynamic fractionation and nanoparticle tracking analysis for nanoparticles. SEM and/or TEM can be employed as appropriate to verify the size and structure of the particles. Surface charge characteristics of the individual particles can be evaluated as a function of pH using acoustic methods or electrophoresis. With respect to stability, gravity settling in graduated cylinders is a simple and industrially accepted method as well as rheological testing.

The slurry compositions described herein may further include one or more additives, such as coagulants, emulsifiers, corrosion inhibitors, oxidizers, surfactants, chelating agents, or pH adjusting agents.

Surfactants useful in the compositions may include anionic surfactants, cationic surfactants, non-ionic, or combinations thereof. Anionic surfactants and cationic surfactants may have more than one anion or cation species, such as Dowfax™, a bi-anion surfactant. Surfactants are described broadly herein as chemical compounds which reduce the surface tension of a composition, or slurry, applied to a substrate during a CMP process. Examples of surfactants include non-ionic surfactants, such as polyethylene oxide, polyethylene oxide derivatives, and polyoxyalkalene alkylphenyl ethers, such as Waco NCW-601A. Examples of anionic surfactants include dodecyl benzene sulfate, sodium dodecyl sulfate, sodium salts of polyacrylic acid (comprising weights between about 1,000 and about 20,000), zinc stearate, and Dowfax™ Examples of cationic surfactants include ammonia based salts, amine based surfactants including benzylamine and octylamine and ammonia based surfactants including poly(bis(2-chloroethyl) ether-alt-1,3-bis(3-(dimetylamino)propyl)urea, and poly (diallydimethylammonium chloride), or combinations thereof. It is contemplated that other surfactants, including Zwitter surfactants and dispersers, or multi-ionic surfactants, which may reduce dielectric removal rate may also be used in the composition and method described herein. The above described surfactants are illustrative and should not be construed or interpreted as limiting. The one or more surfactants can comprise a concentration between about 0.001 volume percent (vol %) and about 10 vol % of the composition. A concentration between about 0.1 vol % and about 1 vol % of the surfactants is used in one embodiment of the composition.

The one or more chelating agents may include one or more amine or amide groups, such as ethylenediaminetetraacetic acid, ethylenediamine or methylformamide, or organic acids, such as iminodiacetic acid or oxalic acid. The one or more chelating agents can be present in an amount between about 0.2 vol % and about 3.0 vol % of the composition. The chelating agent chemically reacts with metal ions removed from the polished surface to form a soluble metal complex to minimize re-deposition of metal ions on the surface of the substrate.

The oxidizers can be any of various conventional oxidizers employed in CMP compositions and processes, such as hydrogen peroxide, ferric nitride, peracetic acid, or other compounds such as iodates. The oxidizers can be present in an amount between about 0.01 vol % and about 8.0 vol % of the composition.

Examples of corrosion inhibitors include any various organic compounds containing an azole group, such as benzotriazole, mercaptobenzotriazole, or 5-methyl-1-benzotriazole. The corrosion inhibitors can be present in an amount between about 0.02 vol % and about 1.0 vol % of the composition.

The composition may further include one or more pH adjusting agents. The pH adjusting agent or agents can be present in an amount sufficient to adjust the pH of the composition to a range between about 2.5 and about 11 and can comprise any of various bases, such as potassium hydroxide (KOH) or ammonium hydroxide, or inorganic and/or organic acids, such as acetic acid, phosphoric acid, or oxalic acid.

It is understood that other chelating agents, oxidizers, corrosion inhibitors, or pH adjusting agents are contemplated for use with the compositions described herein. The above specified components are illustrative and should not be construed as limiting the invention.

Over time, fumed silica particles tend to aggregate, which causes fumed silica slurries to typically have a short shelf life. Therefore, a stabilizer for the fumed silica particles, such as an Fe-containing $SiO_2$ metal oxide, may be added to the slurry compositions described herein in order to increase the shelf life of the compositions. Suitable Fe-containing $SiO_2$ metal oxides may be prepared, for example, from high purity $SiCl_4$ and $FeCl_3$ materials by a pyrogenic flame method, where doping or co-fuming processes can be selected to produce different metal oxides. As described in U.S. Pat. No. 6,406,532 and EP 1,717,285, both of which are expressly incorporated herein by reference, high purity $SiCl_4$ and $FeCl_3$ materials are firstly volatilized in two separate evaporators at different evaporating temperatures. The chloride vapors are introduced into the mixing chamber of a burner by means of nitrogen. They are mixed with hydrogen and dry air and/or oxygen and burned in a reaction chamber. The reaction products are cooled to about 100° C. in the coagulation section. Then, the mixed oxides obtained are separated using a filter. Adhering chloride is removed by treatment with moist air at a temperature in the range of 500° C. and 700° C. The metal oxide particles thus obtained are not simply mechanically mixed oxides of Si and Fe or particles wherein $SiO_2$ and $Fe_2O_3$ are simply mixed; rather, the particles are doped oxides. However, other stabilizers may alternatively be used, and it is understood that the compositions described herein need not include any stabilizers.

CMP slurry manufacturers go to great lengths to ensure that the slurry has the desired particle size distribution at the time of manufacture. Extensive efforts have focused on the elimination of the largest particles in the distribution, primarily through filtration and settling. However, this may not be an optimum solution, as the removal of large particles can decrease the material removal rate and allow damage to accumulate. The approach described herein directly addresses the largest particles with mixtures of both fumed silica particles and spherical silica particles.

High shear rheology ($>10,000$ s$^{-1}$) lends valuable insight into the mechanical component of CMP, specifically that shear thickening correlates with surface scratching. However, in accordance with the present disclosure, shear thickening can be altered to improve the effectiveness of polishing. The present disclosure reintroduces a meaningful mechanical component to the CMP process while maintaining acceptable high shear rheology, and allows for the optimization of formulations and processing parameters.

The compositions described herein can be used with any suitable CMP apparatus, as depicted generically in FIG. 5. Example CMP apparatuses commercially available include those under the names Mirra® CMP System or Obsidian 8200C System. A typical CMP apparatus includes a lower machine base with a table top mounted thereon and a removable outer cover, where the table top supports a series of polishing stations and a transfer station. The polishing stations include a rotatable platen having a polishing pad disposed thereon. Each platen may be a rotatable aluminum or stainless steel plate connected to a platen drive motor. The polishing stations may include a pad conditioner apparatus with a rotatable arm holding an independently rotating conditioner head and an associated washing basin. The pad conditioner apparatus maintains the condition of the polishing pad so that it effectively polishes the substrates. Each polishing station may include a conditioning station if the CMP apparatus is used with other pad configurations. Each polishing station may have a slurry arm that includes two or more supply tubes to provide one or more chemical slurries and/or water to the surface of the polishing pad. The slurry arm delivers the one or more chemical slurries in amounts sufficient to cover and wet the entire polishing pad. Each slurry arm also includes several spray nozzles that can provide a high-pressure fluid rinse on to the polishing pad at the end of each polishing and conditioning cycle. A rotatable carousel is positioned above the lower machine base, and presses the substrates against the polishing pads.

Defects during the CMP process are estimated to cost the semiconductor industry billions of dollars annually. Overall, increasing the critical shear rate (CSR) to higher shear rates will lead to lower scratch rates and defect formation during polishing, which can save the CMP industry millions or even billions of dollars per year. Stable bimodal suspensions with limited or no shear thickening leads to fewer defects during polishing. And while CMP is primarily used for logic devices, the advanced polishing is finding increased application in memory chips, microelectronic machines, and other hybrid microelectronic-mechanical devices. The present disclosure may also be useful in applications which utilize large area silicon technology, such as flat panel displays and solar cells, or in industries that could benefit from uniform application of filler or coatings, ceramics through more efficient processing, and pharmaceuticals by creating stabilized time-release formulations. Controlled rheology of stable bimodal systems can also be expanded to ceramics processing or creating more stable composite materials for sports, safety, or space equipment (e.g., to protect astronauts from space debris). Thus, other than CMP, the slurry compositions described herein could also be used in applications such as spray coating, protective materials (e.g., sports, vehicular, space, medical, construction), or equipment (helmets, rackets, etc.). The hysteresis demonstrated by the slurry compositions herein (as seen, for example, in FIG. 11) may be advatangeous for applications wherein a material is desired to be toughened with the slurry. The slurry compositions may also be useful for battery applications. In such applications, it may be desirable for the monovalent salt present in the slurry composition to be LiCl. Thus, the ability to tune shear thickening using suspensions of fumed silica and spherical silica has wide ranging applicability.

The compositions and methods described herein may also be made available via a kit containing one or more key components. A non-limiting example of such a kit comprises fumed silica particles or spherical silica particles in one container, a solvent in another container, and a monovalent salt solution having a concentration ranging from about 0.15 M to about 3 M in another container, where the containers may or may not be present in a combined configuration. Many other kits are possible, such as kits comprising a suspension of fumed and/or spherical silica particles instead of the solvent being packaged separately. The kits typically further include instructions for using the components of the kit to practice the subject methods. The instructions for practicing the subject methods are generally recorded on a suitable recording medium. For example, the instructions may be present in the kits as a package insert or in the labeling of the container of the kit or components thereof. In other embodiments, the instructions are present as an electronic storage data file present on a suitable computer readable storage medium, such as a flash drive. In other embodiments, the actual instructions are not present in the kit, but means for obtaining the instructions from a remote source, such as via the internet, are provided. An example of this embodiment is a kit that includes a web address where the instructions can be viewed and/or from which the instructions can be downloaded. As with the instructions, this means for obtaining the instructions is recorded on a suitable substrate.

EXAMPLES

Example 1

This example describe a comprehensive evaluation of CMP slurry shear thickening under high shear rates (>10,000 $s^{-1}$), the implementation in situ of small-angle light scattering during rheological characterization (rheo-SALS) to monitor agglomerate formation during shear thickening (Rheo-SALS images indicated the formation of micrometer scale structures that directly correlated with the discontinuous and irreversible shear thickening), the development of a methodology for the synchronized measurement of rheological behavior while polishing a semiconductor wafer, and the development of bimodal slurry compositions which reduce shear thickening.

High Shear Rheology

During the CMP process, aqueous slurry is dispensed onto a polishing pad, which is rotating at high speed (~100 rpm). A dielectric wafer is positioned above the polishing pad and pressed into near contact at a given downward loading force. The colloidal slurry is then sandwiched into a thin film (1-100 µm) between the two disks that rotate in unison. The combination of the orthogonal force from the wafer, the abrasive nature of the slurry, and the grinding action of the polishing pad leads to synergistic chemical and mechanical removal of material. During CMP, the slurry will typically experience shear rates up to 1,000,000 $s^{-1}$. The shear rates induced by CMP are up to 1,000 times greater than any other shear rate that the slurry experiences in its lifetime. Under this extreme shear environment, it is believed that individual slurry particles (~0.2 µm) are driven together to form large agglomerates (>1 µm), which cause a spike in the slurry's viscosity, known as shear thickening. These large agglomerates are then believed to dig into the wafer surface, causing CMP-induced defects.

Figure 1A:
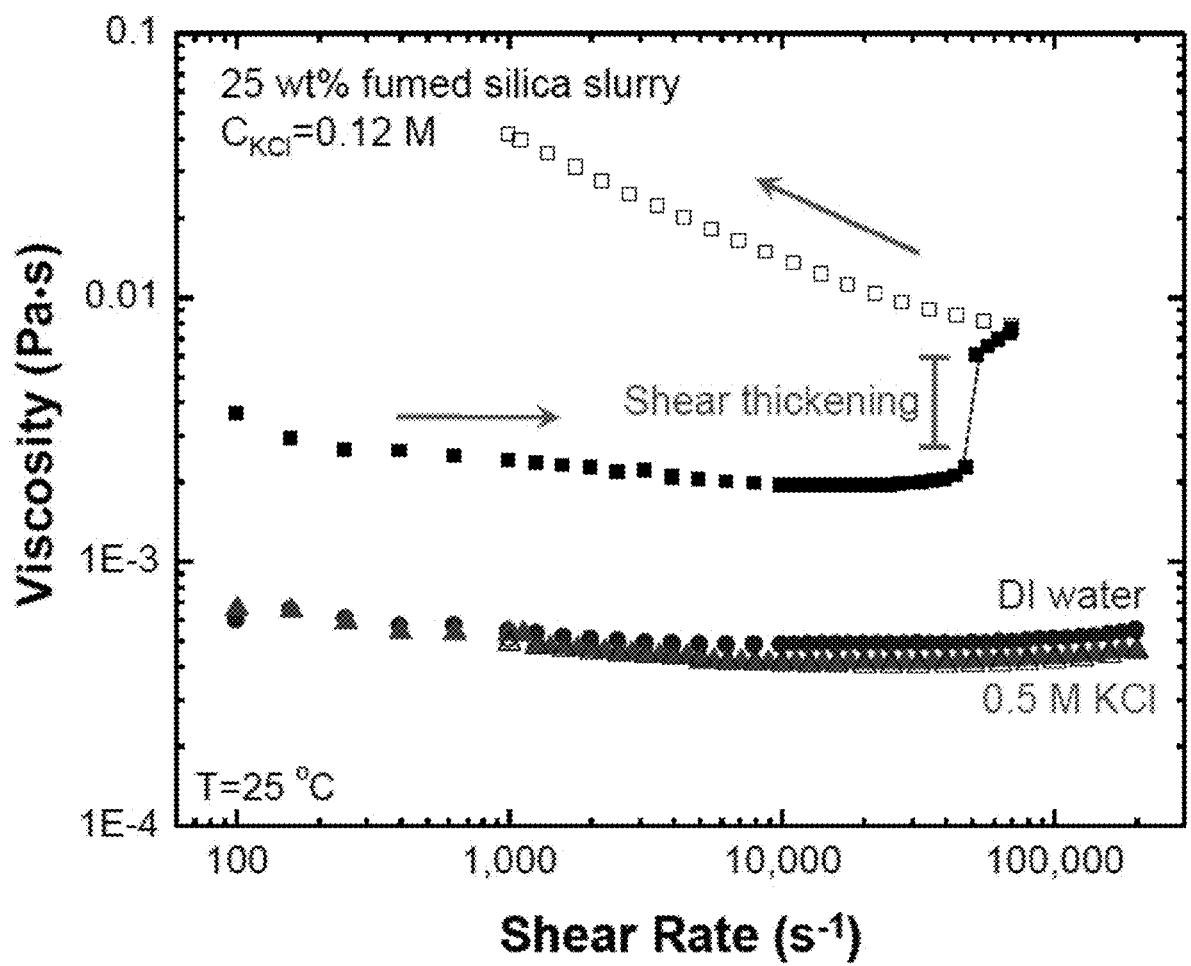
FIGS. 1A-1B: Steady state shear rate ramp (filled symbols) and reduction (open symbols) for a 25 wt % silica slurry with 0.12 M KCl (squares), DI water (circles), and a 0.5 M KCl solution (triangles) (FIG. 1A), and electron micrograph showing the size and irregular shape of fumed silica (FIG. 1B). The critical thickening shear rate for the silica slurry is ~54,000 s$^{-1}$. DI water and 0.5 M KCl are control experiments.
Figure 1B:
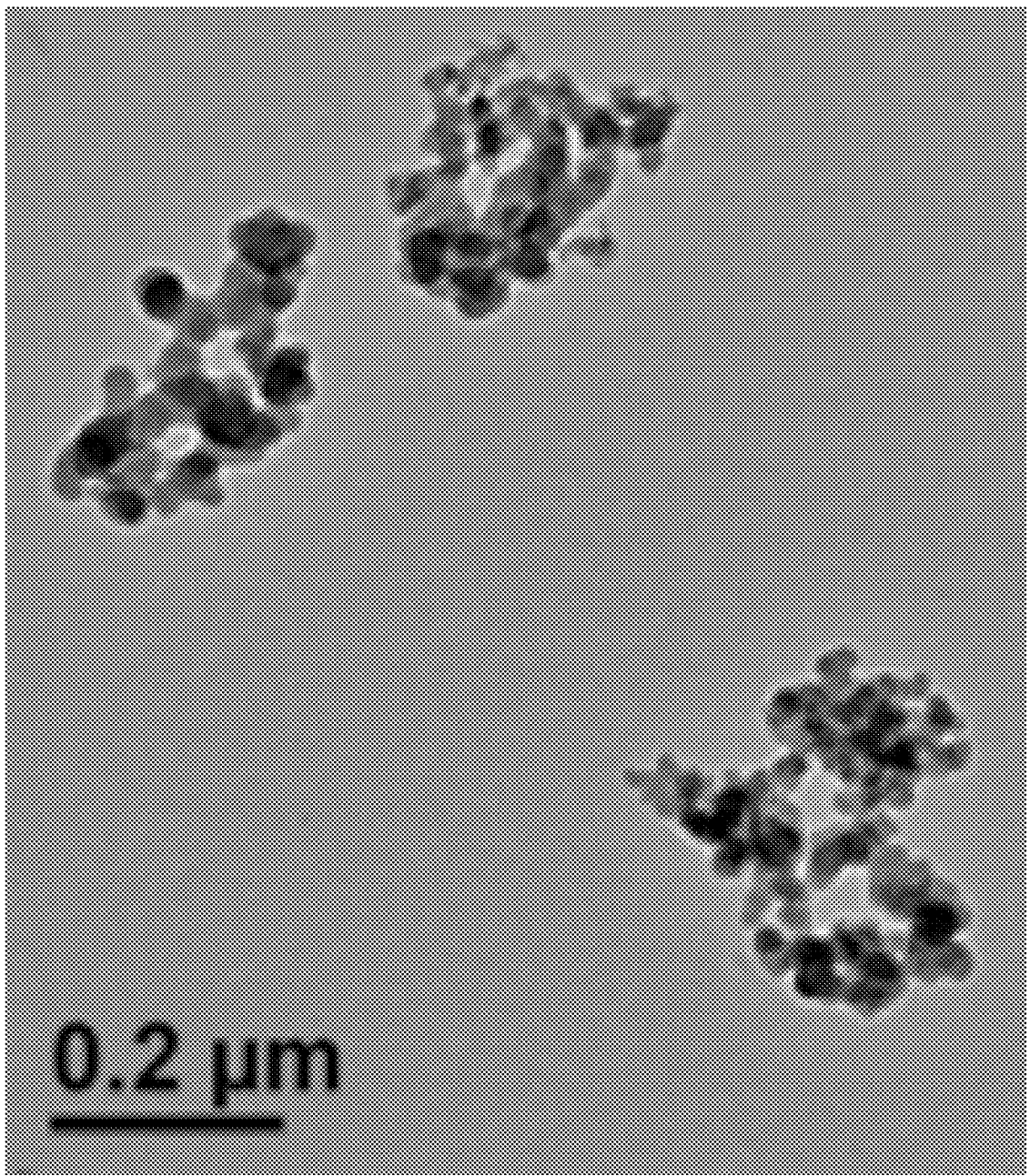

Thus, the shear thickening behavior of fumed silica CMP slurries under process relevant shear rates (>10,000 $s^-$) was investigated. A technique to measure the high shear rheological behavior of CMP slurries using a parallel-plate geometry at small gap heights (<100 µm) in a conventional rotating rheometer was successfully developed. The concentrated (20 to 34 wt %) fumed silica slurries discontinuously and irreversibly shear thicken at shear rates exceeding 10,000 $s^{-1}$ (FIG. 1A). The thickening events were free of outside influences, such as viscous heating and sample evaporation. The thickening was also independent of experimental gap height and, thus, not triggered by a critical rheometer speed. Overall, the thickening response of the fumed silica slurries was confirmed to be a true shear-induced response. Next, the shear thickening was tuned by altering the silica concentration, ionic strength via chloride salts, or pH using different bases.

Real Time Changes in Particle Size Under High Shear

In situ small-angle light scattering (SALS) in conjunction with rheological measurements (rheo-SALS) probed for the formation, shape, and size of shear-induced agglomerates during shear thickening. Modifications to a commercial rheo-SALS device were needed to obtain the extreme shear rates (>10,000 s$^{-1}$) to induced thickening while collecting scattering images. Rheo-SALS images indicated the presence of micrometer scale structures (2 to 3 µm) that directly correlated with the discontinuous and irreversible shear thickening of the fumed silica slurries (FIGS. 2A-2B). Distinct SALS patterns were only observable during and after thickening. The larger particles observed with rheo-SALS were verified ex situ using dynamic light scattering. A significant population of "large" particles from 300 to 700 nm was detected exclusively in the particle size distribution of the shear-thickened sample. Therefore, substantial micron-scale agglomerates were observed exclusively at the high shear rates within the rheo-SALS device, which is further examined using a new rheo-polishing technique.

Thickening Directly Correlates with Scratches

Figure 3A:
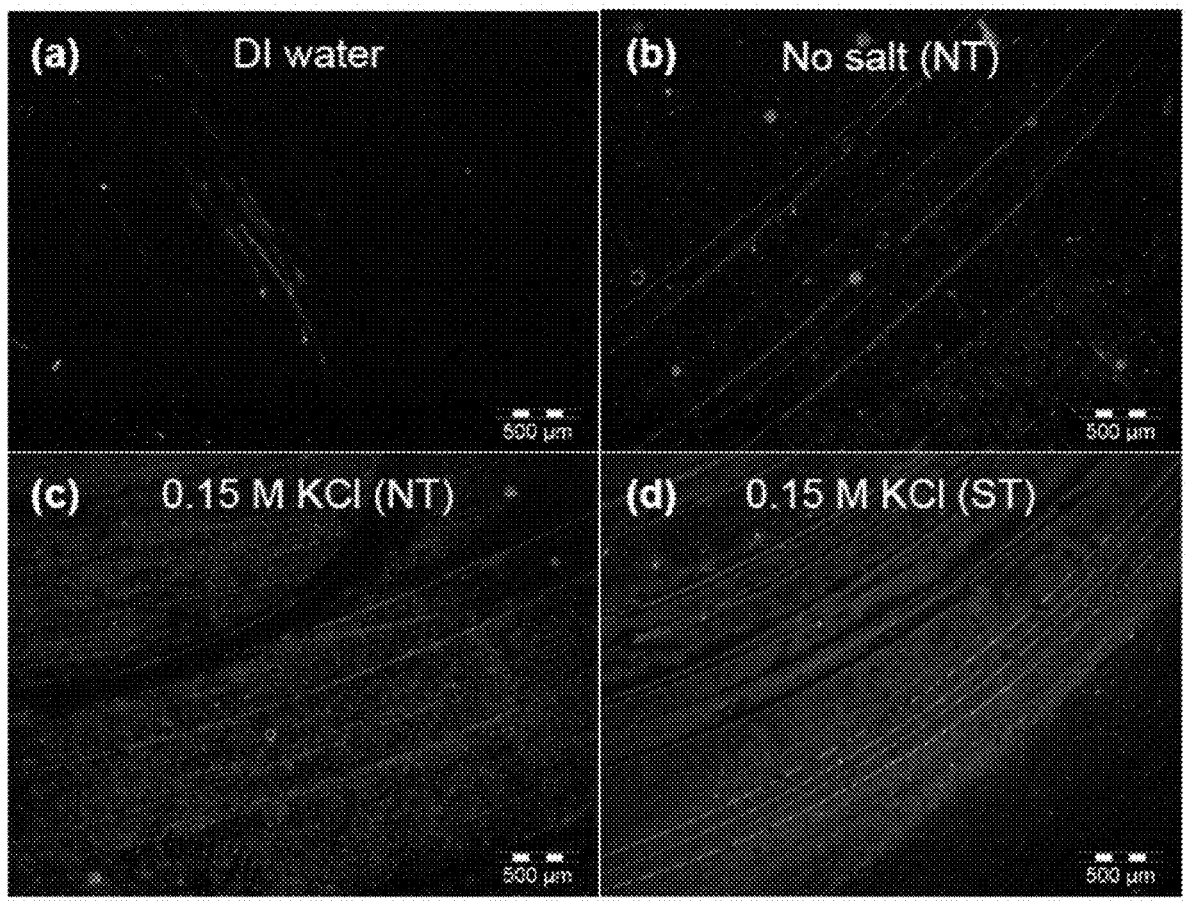
FIGS. 3A-3B: Surface optical microscopy images of a 2 inch TEOS wafer "polished" with: DI water (top left) and a 25 wt % silica slurry containing no salt (NT) (top right), 0.15 M KCl (NT) (bottom left), and 0.15 M KCl (ST) (bottom right) (FIG. 3A), and normalized number of surface scratches per image examined with a non-contact profilometer for the three different polishing cases (excluding DI water): no salt (NT), 0.15 M KCl (NT), and 0.15 M KCl (ST) (FIG. 3B). NT indicates "no thickening" was observed during polishing, while ST indicates "shear thickening" was observed during polishing. The displayed p-values are from a two sample t-test comparing the three polishing cases with one another.
Figure 3B:
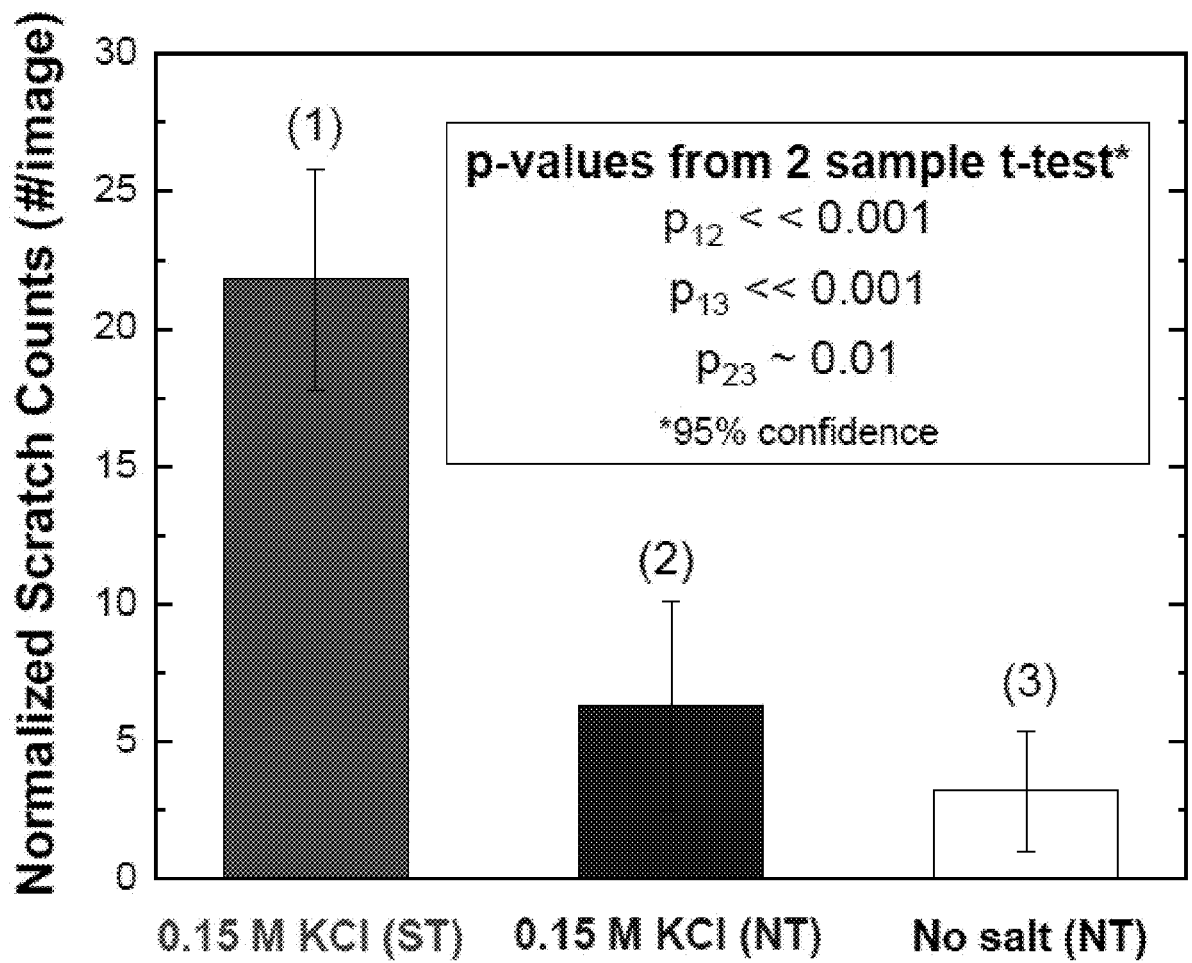

Leveraging the high shear rheology and rheo-SALS, a unique methodology that allowed for the in situ measurement of rheological behavior while "polishing" a wafer of semiconducting material was developed. The rheo-polishing technique permits shear thickening of the CMP slurries to be directly linked to surface scratching during a polishing event. Damage causing particles can be generated during the polishing process itself, and are not necessarily present in the slurry as introduced to the polishing tool. In this example, the frequency of surface scratches significantly increased (by more than 3-fold) when thickening of the fumed silica slurry was observed (FIGS. 3A-3B). The scratches, at least 0.1 µm deep with an aspect ratio greater than 5, are believed to be the result of shear-induced agglomerates. These shear-induced agglomerates exist in small numbers, accounting for 2% or less of the slurry's total particle population (making them challenging to collect and detect ex situ). However, these undesirable agglomerates are frequent enough to lead to statistically significant and severe surface damage.

Bimodal Slurries with Microparticles and Nanoparticles

CMP slurries were synthesized using standard pilot scale methods and formulations similar to commercially available slurries. Current approaches to CMP slurry formulation tend to focus on either high (~10-11) pH for dielectrics or low (~2-4) pH for metals polishing. At least one model system in each pH regime was examined. For the low pH region, silica was used as a microparticle and ceria was used as a nanoparticle. Silica has an ill-defined isoelectric point, although general consensus places it in the vicinity of pH ~2.5. Ceria, on the other hand, has an isoelectric point in the range of 6 to 9 and is strongly positively charged in the acidic region. Spherical silica particles produced by the Stöber process are readily available in a wide variety of sizes. Ceria can be obtained commercially or produced using established techniques.

Polishing experiments were conducted, which allowed the comparison of removal and defect formation rates to high shear rheology for stabilized, bimodal slurries. FIG. 6 shows an image of the larger silica particles haloed by the smaller cerica particles. However, the shear thickening was not reproducibly lessened by these slurries.

Mechanistic Model for Shear Thickening and Polishing Under High Shear

Defect formation has traditionally been assumed to be directly caused by large particles that were present in the slurry at the time of manufacture. The assumed importance of these large particles has led the industry to depend on the "large particle count" as a predictor of slurry quality. However, large particle counts have often been inadequate for predicting defect formation, while shear thickening has been shown to cause some, but not all, defects, as discussed earlier. Therefore, a single explanation for defects is inadequate given the complexity of the problem, so the focus in this objective is to examine the mechanical portion of polishing and building a relationship between defects, particle size, shear thickening, and the forces at play.

Figure 7:
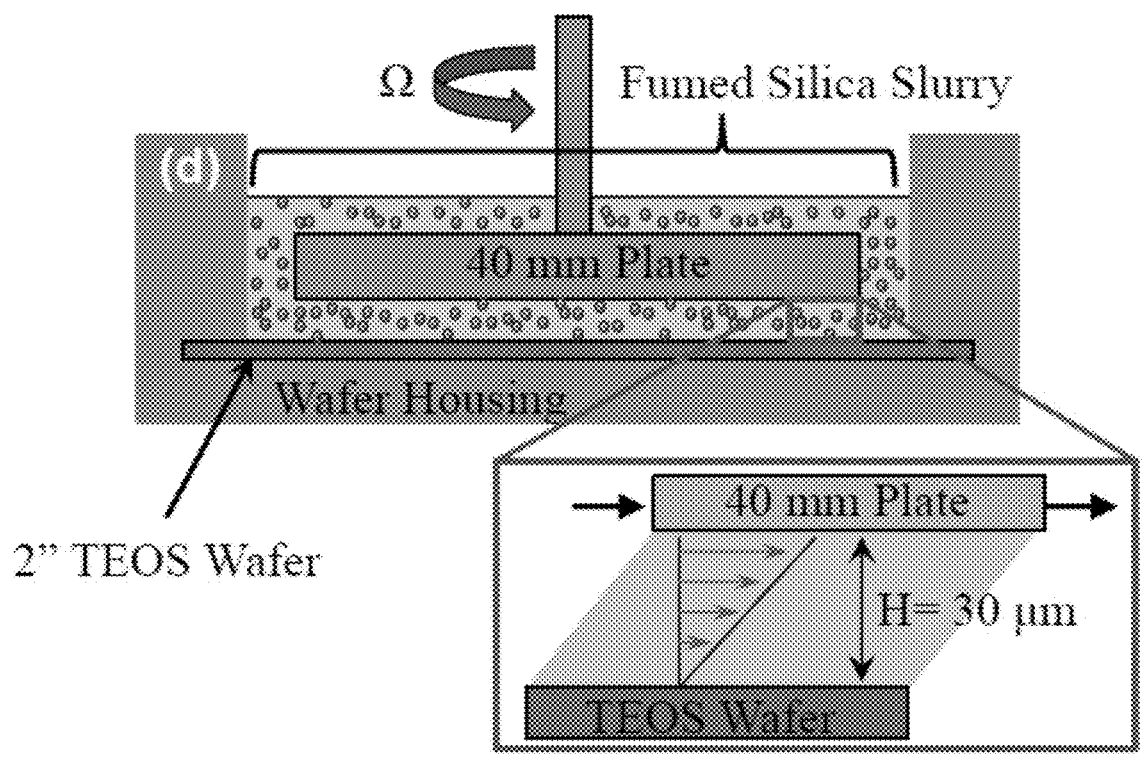
FIG. 7: Schematic diagram of rheo-polishing.

Leveraging a newly developed rheo-polishing technique (FIG. 7), the effects of the large particles, small particles, and shear thickening/shear-induced agglomerates on defect formation can be isolated. In the rheopolishing method, 2-inch tetraethyl orthosilicate (TEOS) wafers are mounted in a stationary fixture attached to the stationary plate of a controlled stress rheometer. A sample of the slurry is "sandwiched" between the wafer and a 50 mm parallel upper plate, and a shear sweep is initiated. This provides direct control over a wide variety of variables. The shear rate and shear duration are easily controlled. In addition, temperature control can be used to alter viscosity of the fluid phase.

The rheo-polishing method provides tremendous flexibility to set experimental parameters at a very modest cost, i.e., without expensive substrate materials or need for a clean room. In addition, the simple mechanical nature of the components allow for rapid sample changes without the extensive flushing and conditioning of a traditional polishing pad.

Figure 8:
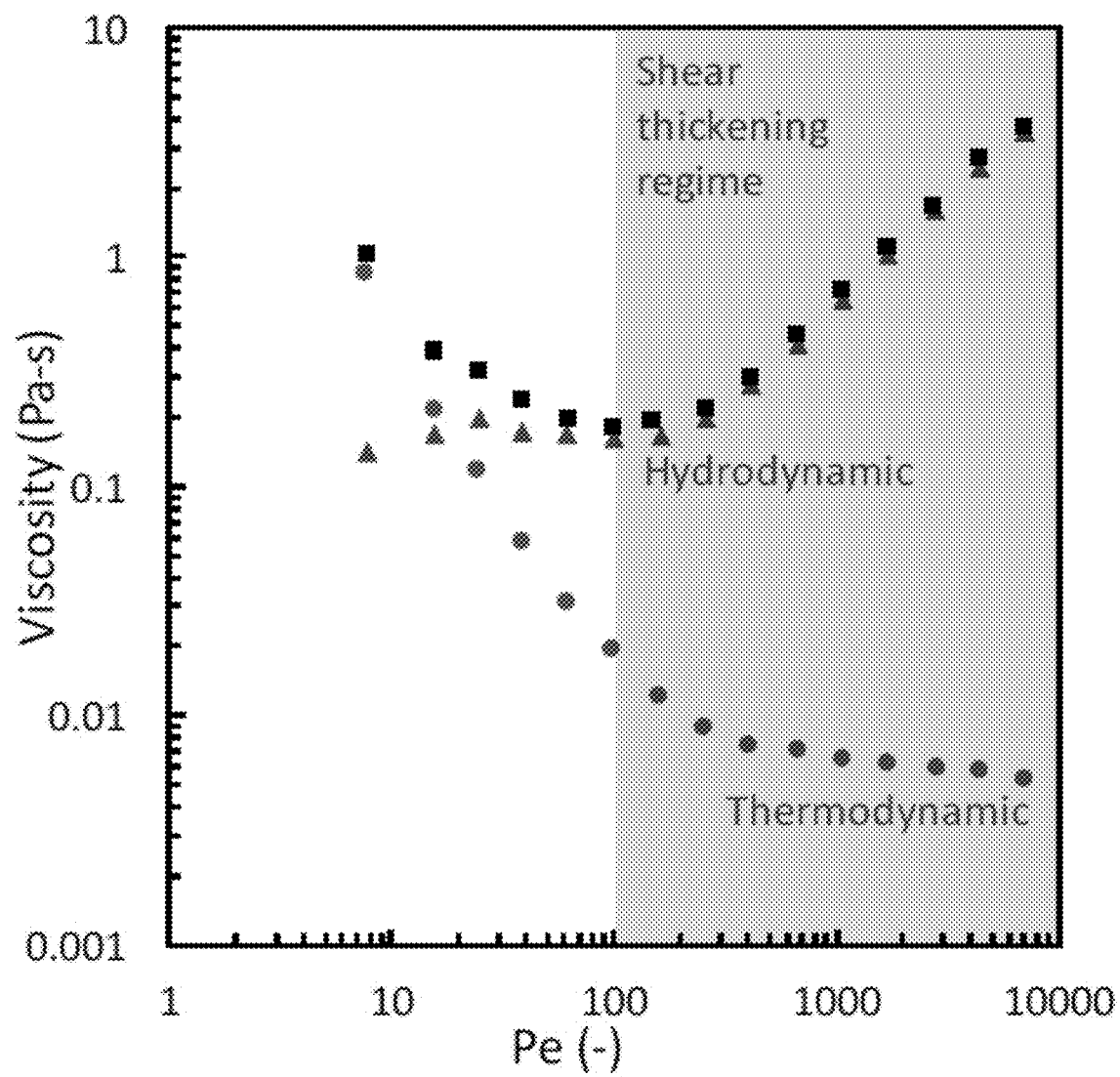
FIG. 8: Viscosity as a function of Peclet number for 400 nm spherical silica in tetrahydrofurfural.

Conceptualizing the dynamics of a colloidal dispersion can begin by examining a ratio between Brownian motion and hydrodynamics. This ratio is called the Péclet number (Pe), which can be written as:

$$Pe = \frac{\tau a^3}{k_B T}$$

where the numerator captures the hydrodynamic contributions through the shear stress (τ) and a characteristic length scale (a), the particle diameter for a sphere. The denominator quantifies the Brownian motion through a thermal energy, which is related to the thermodynamic contribution to the viscosity in FIG. 8. On one hand, at higher Pe, shear thickening occurs and hydrodynamics dominate for high shear polishing. On the other hand, low Pe is indicative of a larger impact of Brownian forces or other electrostatic contributions, which are significant for particle stability during haloing.

Example 2

Materials

The CMP slurry is usually an aqueous mixture composed of an active chemical helping with removal of excess material from the dielectric wafer. In this example, high concentration (30 wt %) fumed silica, as a simplified version of the commercial product, provided by Cabot Microelectronics Corporation (Aurora, Ill., USA), was investigated. Fumed silica aggregates made by fusing small spherical (5-50 nm) particles together using a high temperature flame have a size of 150±20 nm determined via dynamic light scattering (DLS). Monodisperse commercially available spherical silica slurries of 30-50 wt % silica and particle sizes of 12-120 nm (measured using DLS) were purchased from AkzoNobel Specialty Chemicals (Marietta, Ga., USA), Nissan Chemical America Corporation (Houston, Tex., USA), and Nyacol Nano Technologies (Ashland, Mass., USA). KCl and NaCl were purchased from Fisher Chemicals and served as a thickening agent when added to the particle mixtures. Table 1 summarizes the properties of the particles employed in this example. All of the parent silica slurries are electrostatically stabilized to a pH range (9-11) well beyond silica's isoelectric pH (2).

TABLE 1

Particle properties

| Particle Type | Commercial Name | Provider | Silica content (wt %) | pH | Particle Size (nm) | Surface Area (m$^2$/gr) |
|---|---|---|---|---|---|---|
| Fumed | Cabosil 1030 | Cabot | 30 | 10.5 | 180 | — |
| Spherical | Bindzil | AkzoNobel | 42 | 9.5 | 12 | 221 |
| Spherical | Levasil CS50 | AkzoNobel | 50 | 9.5 | 112 | 30 |
| Spherical | MP1040 | Nissan | 42 | 9.5 | 120 | — |
| Spherical | Nexil 125-40 | Nyacol | 45 | 9.5 | 110 | 35 |

Sample Preparation

The stock fumed and spherical silica dispersions were diluted by ultra-pure DI water (18Ω). The ionic strength of the samples was adjusted using salt solutions of various molarities by conducting a series of stirring and sonication mixing methods. In the first stage, two parent fumed and spherical solutions were prepared by adding the required amount of stock fumed (spherical) to a vial. While mixing on the stirrer plate, DI water and then salt were added gradually and mixed for 1 h. After sonicating the solution for 1 more hour and using the same preparation protocol described, the fumed-spherical silica mixtures were prepared from parent samples and stored under ambient conditions for 24 h before commencing rheological tests. All measurements were conducted in a 1 week time interval since high silica (>20 wt %) and salt (>0.1 M) concentrations may jeopardize the stability of the samples by forming large silica agglomerates. For this example, fumed and spherical silica concentration, parent salt concentration, and salt types were altered to ensure that shifting the CSR to higher/lower shear rates was achievable in a range of silica and salt contents.

Rheology

High shear rate rheological measurements were conducted using TA Instruments' DHR3 rheometer (New Castle, Del.) with a parallel-plate geometry. The top rotating plate was constructed of stainless steel (60 mm in diameter) and the bottom stationary plate was a temperature controlled Peltier fixture. The gap spacing between the two plates was 50 microns, which allows for high shear rates up to 200,000 s$^{-1}$. The silica slurry was loaded between the two plates using micro pipettes to ensure perfect filling of the gap. To reduce the effect of solvent, evaporation on rheological studies was minimized using a solvent trap and running the test at 25±0.1° C.

A steady state flow sweep procedure was employed to observe the CSR and degree of thickening for each CMP slurry. A pre-shear step at 1000 s$^{-1}$ was conducted for each sample to remove the impact of sample preparation method on viscosity data. Shear rates ranging from 100 to 200,000 s$^{-1}$ were examined with a data resolution of 10 pt/decade for lower and 20 pt/decade for higher shear rates. A reverse ramp going from higher to lower shear rates followed the main procedure to test irreversibility of the mixtures thickening behavior. Secondary disturbances of the shear rheology at small gaps is known to impact viscosity results.

Results

Figure 11:
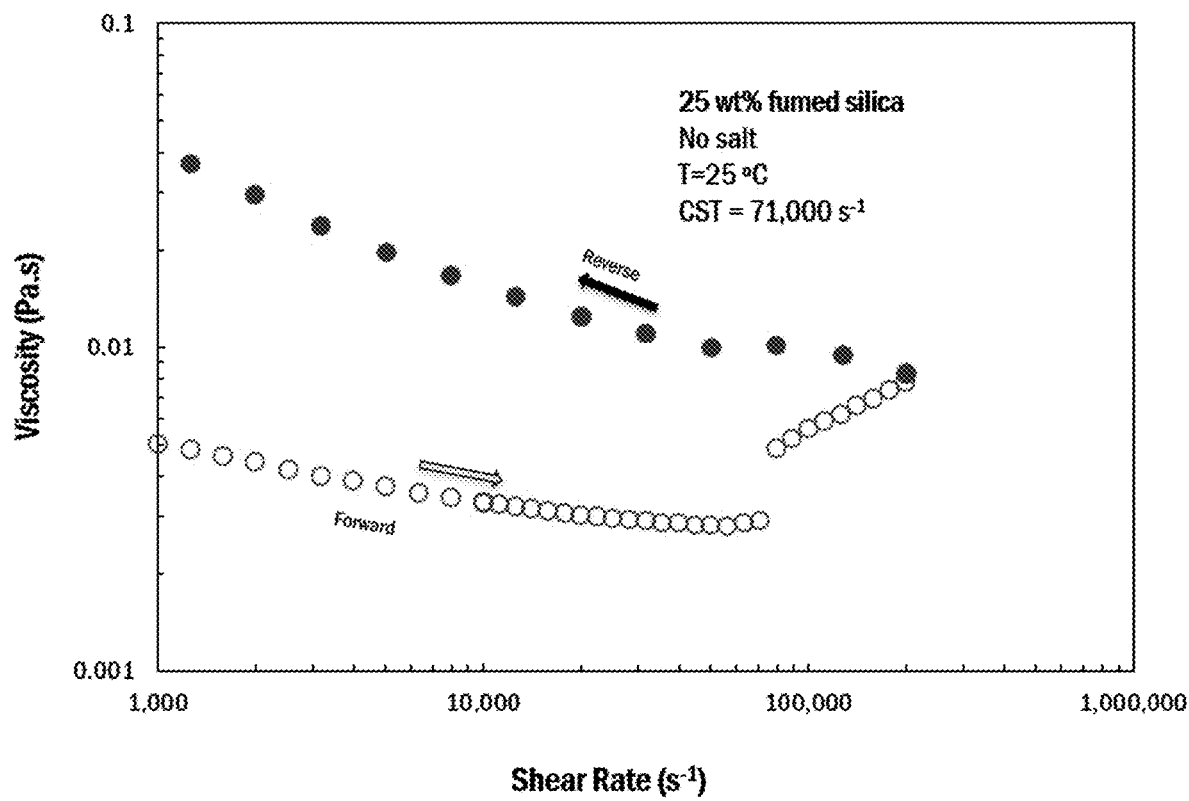
FIG. 11: Graph showing that fumed silica particles, in a slurry without spherical silica particles, thicken.

FIG. 11 shows the thickening behavior of a slurry having 25 wt % fumed silica, as well as the hysteresis behavior exhibited by the slurry. No salt or spherical silica particles were present in this slurry. The critical shear thickness was reached at a shear rate of about 71,000 s$^{-1}$. FIG. 11 shows that fumed silica particles thicken at high shear rates.

Figure 12:
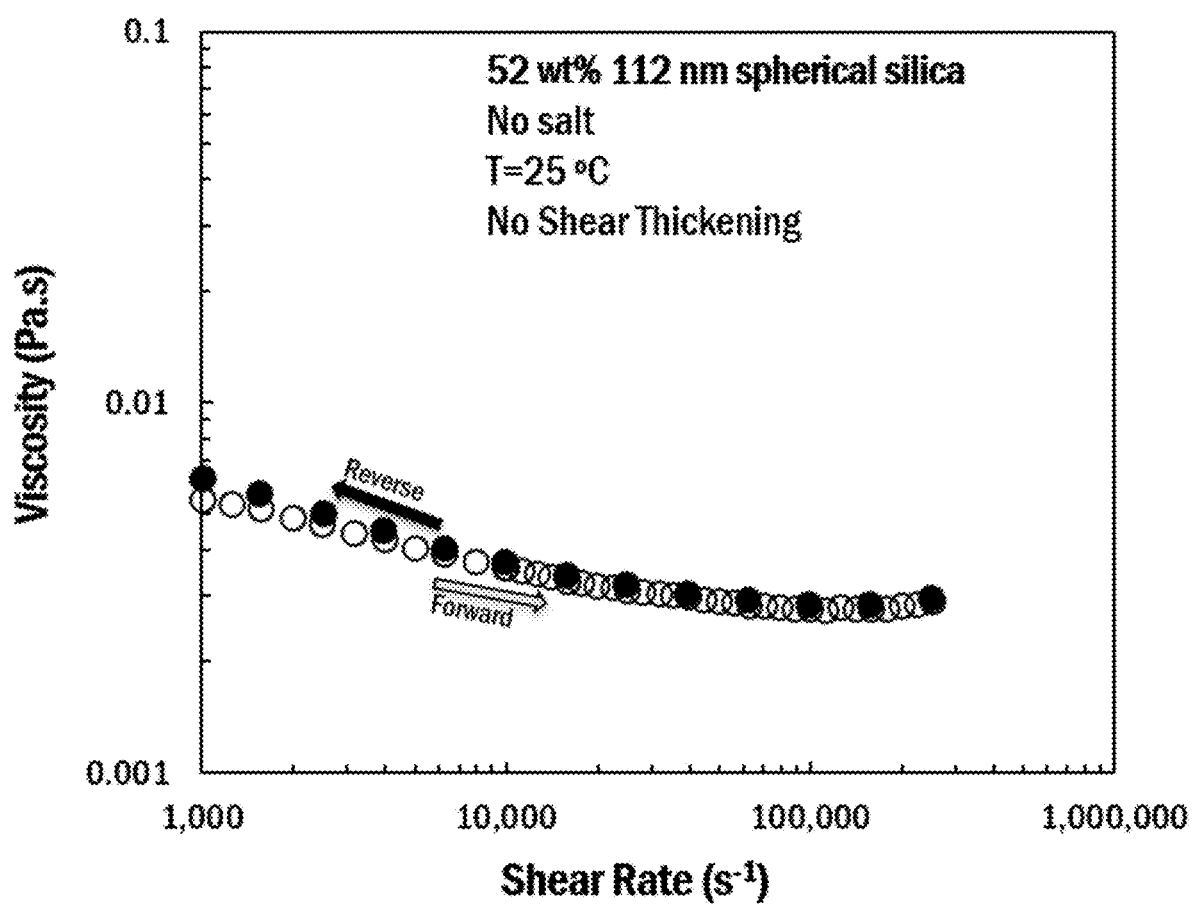
FIG. 12: Graph showing that spherical particles, in a slurry without fumed silica particles, do not thicken.

FIG. 12 shows that spherical silica particles do not exhibit significant thickening at high shear rates. No shear thickening was observed at higher shear rates for a slurry having a concentration of 52 wt % spherical silica parties with a diameter of 112 nm. No salt or fumed silica particles were present in this slurry, and the temperature was 25° C. FIG. 12 also shows a lack of hysteresis behavior exhibited by the slurry having only spherical silica particles.

Figure 13:
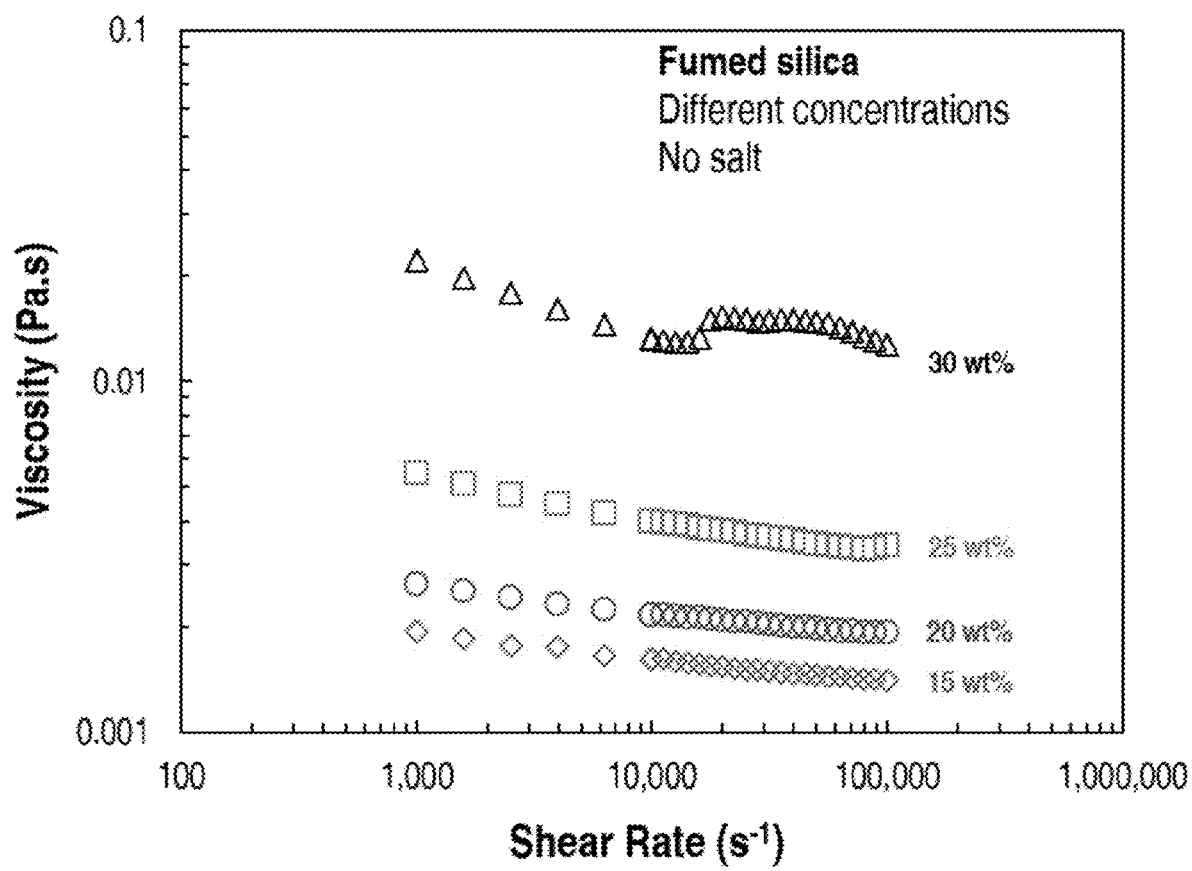
FIG. 13: Graph showing that altering silica content without salt can shift the critical shear thickness.

FIG. 13 shows that the CSR of a fumed silica slurry can be shifted by altering the silica content of the slurry, without salt. Fumed silica slurries having fumed silica concentrations of 15 wt %, 20 wt %, 25 wt %, and 30% were tested. As seen in FIG. 13, a 15 wt % fumed silica slurry exhibited the lowest viscosity at higher shear rates, and a 30 wt % fumed silica slurry exhibited the highest viscosity at higher shear rates.

Figure 14:
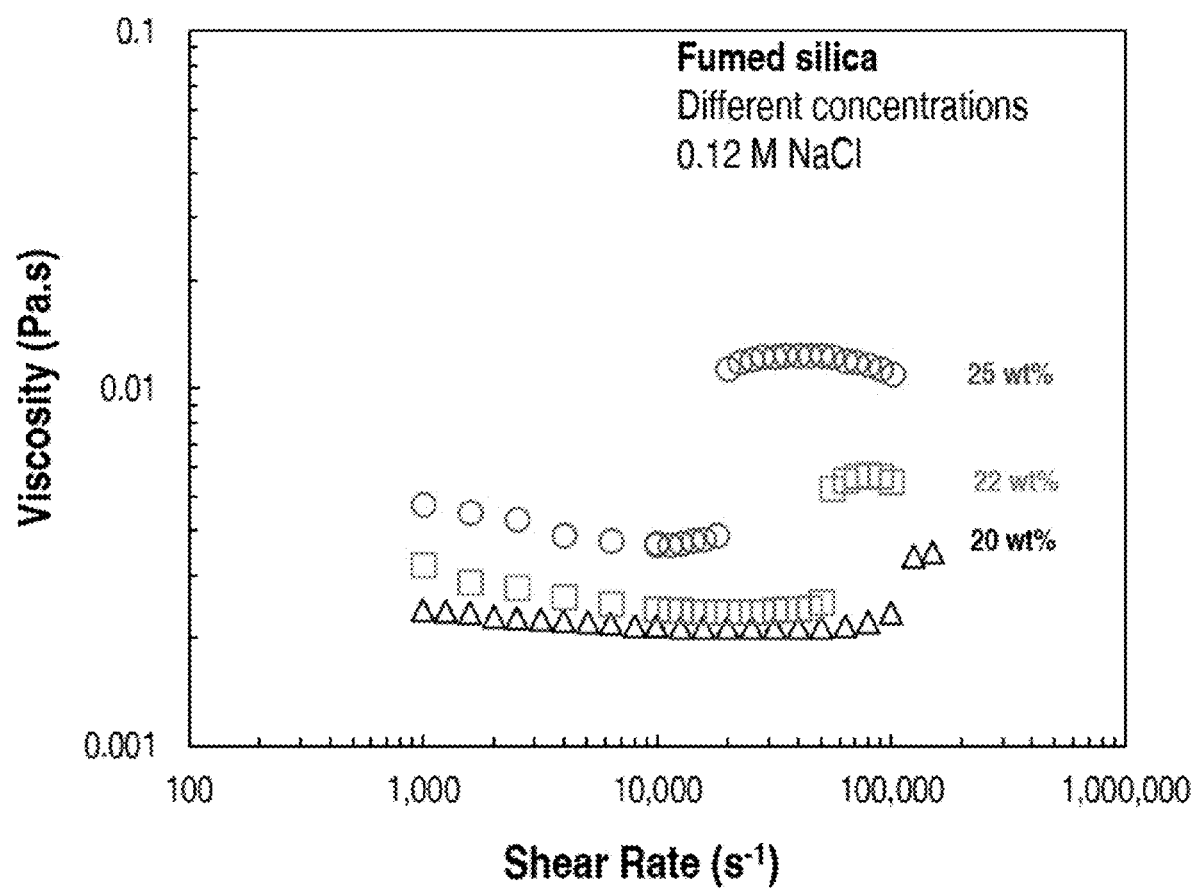
FIG. 14: Graph showing that the CSR of a fumed silica slurry can be shifted by altering the silica content of the slurry, with salt.

FIG. 14 shows that the CSR of a fumed silica slurry can be shifted by altering the silica content of the slurry, with salt. Fumed silica slurries having fumed silica concentrations of 20 wt %, 22 wt %, and 25 wt %, each having a NaCl concentration of 0.12 M, were evaluated. As seen in FIG. 14, the thickening at higher shear rates increased as the silica content increased. Thus, the slurry having 25 wt % fumed silica had the highest viscosity at high shear rates, and the slurry having 20 wt % fumed silica had the lowest viscosity at high shear rates.

Figure 15:
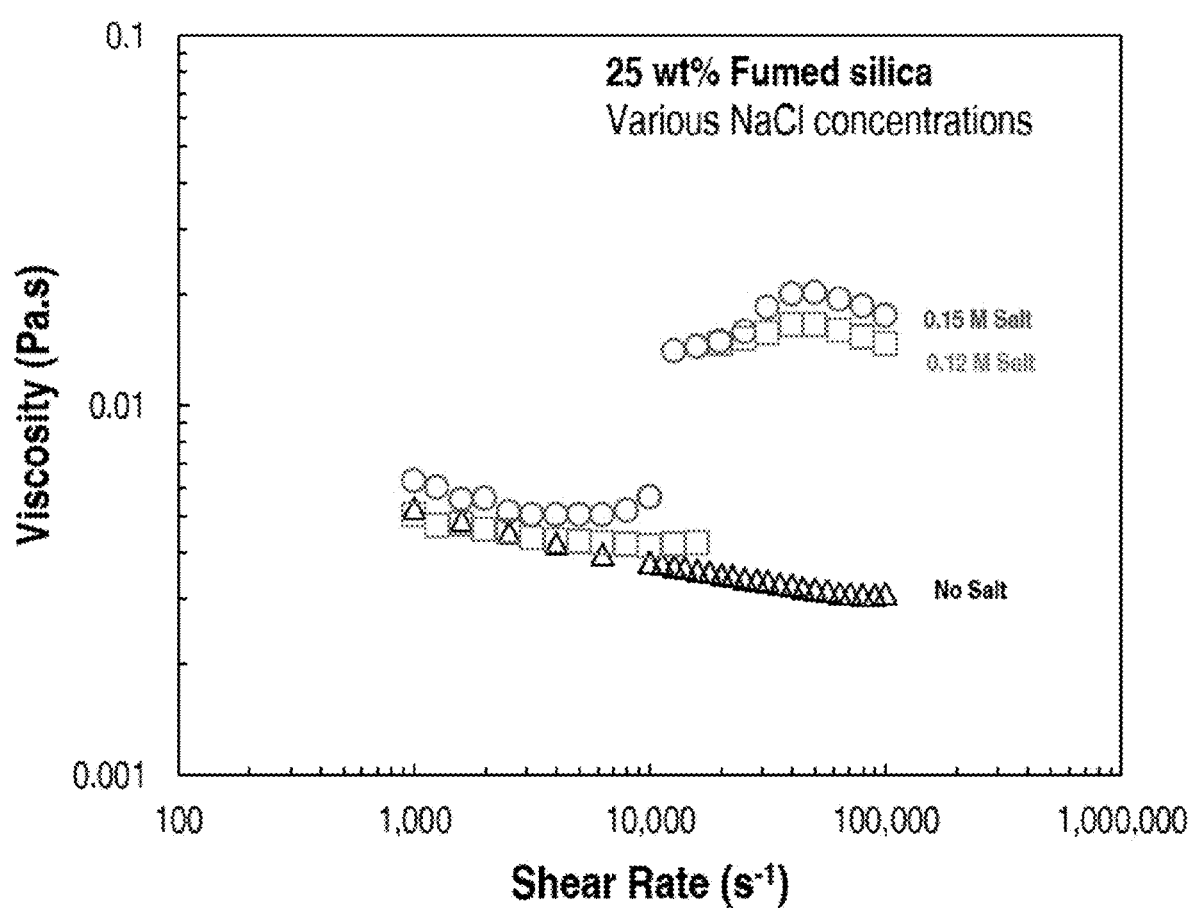
FIG. 15: Graph showing that the CSR of a fumed silica slurry can be shifted by altering the salt content of the slurry.

FIG. 15 shows that the CSR of a fumed silica slurry can be shifted by altering the salt content of the slurry. Two slurries each having 25 wt % fumed silica were evaluated. One slurry had a salt concentration of 0.15 M, and the other slurry had a salt concentration of 0.12 M. The salt in each slurry was NaCl. A third slurry having 25 wt % fumed silica without salt is shown in FIG. 15 for comparison. As seen from FIG. 15, the slurry having a 0.12 M salt concentration exhibited a lower viscosity at high shear rates compared to the slurry having a 0.15 M salt concentration. Both of the salt-containing slurries had a higher viscosity than the slurry without salt.

Figure 16:
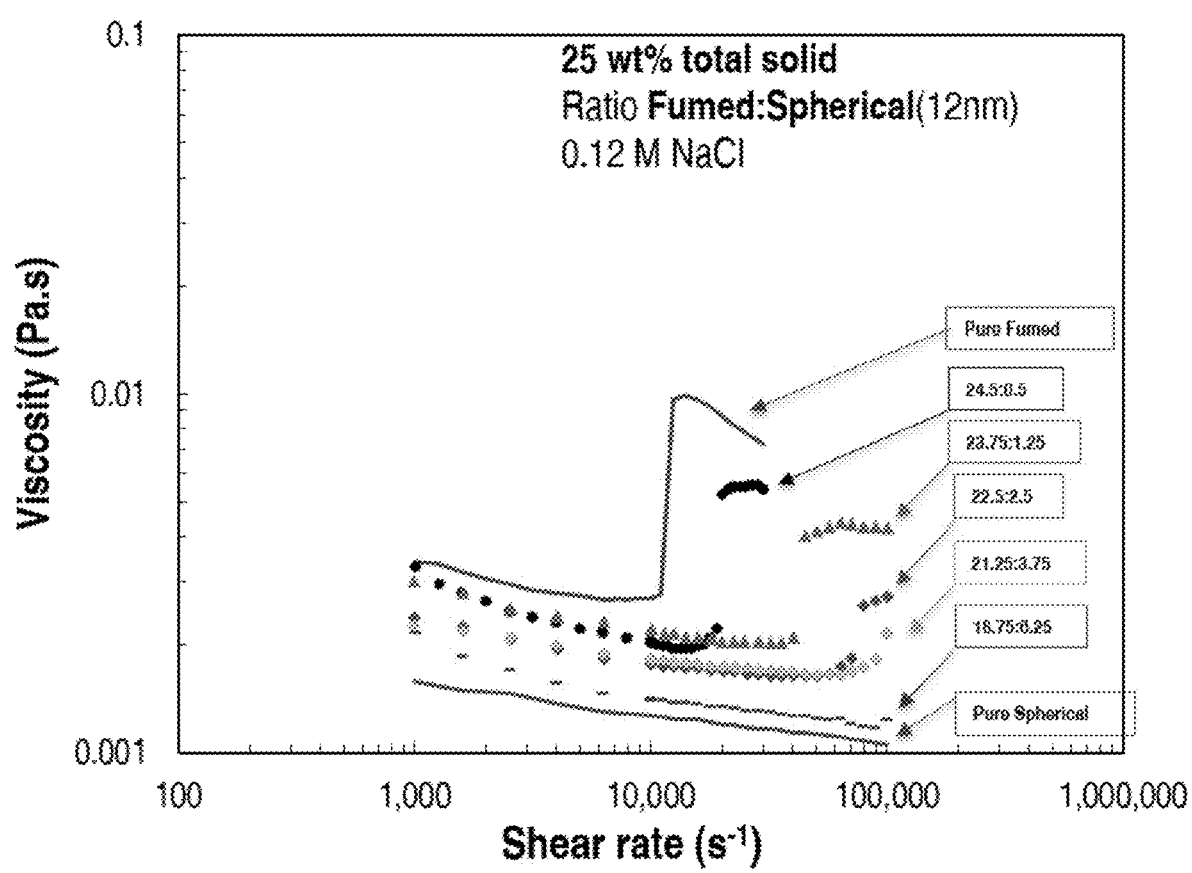
FIG. 16: Graph showing that mixing fumed and spherical silica particles alters thickening. The graph shows the viscosity as a function of shear rate for several slurries with varying fumed:spherical ratios, each having 25 wt % total solids, 12 nm spherical silica particles, and a salt concentration of 0.12 M NaCl. A pure fumed silica slurry and a pure spherical slurry are also shown for comparison.

FIG. 16 shows that mixing fumed and spherical silica particles alters thickening. Five different slurries were evaluated at varying ratios of fumed:spherical silica particles (namely, 24.5:0.5, 23.75:1.25, 22.5:2.5, 21.25:3.75, and 18.75:6.25), along with a pure fumed silica slurry and a pure spherical silica slurry for comparison. The slurries with fumed silica contained 25 wt % fumed silica, and the spherical silica particles had a diameter of about 12 nm. All of the slurries had a salt concentration of 0.12 M NaCl. As seen from FIG. 16, as the ratio of fumed:spherical decreased, the viscosity of the slurry at high shear rates also decreased. Thus, as more spherical silica particles were added, shear thickening was lessened.

Figure 17:
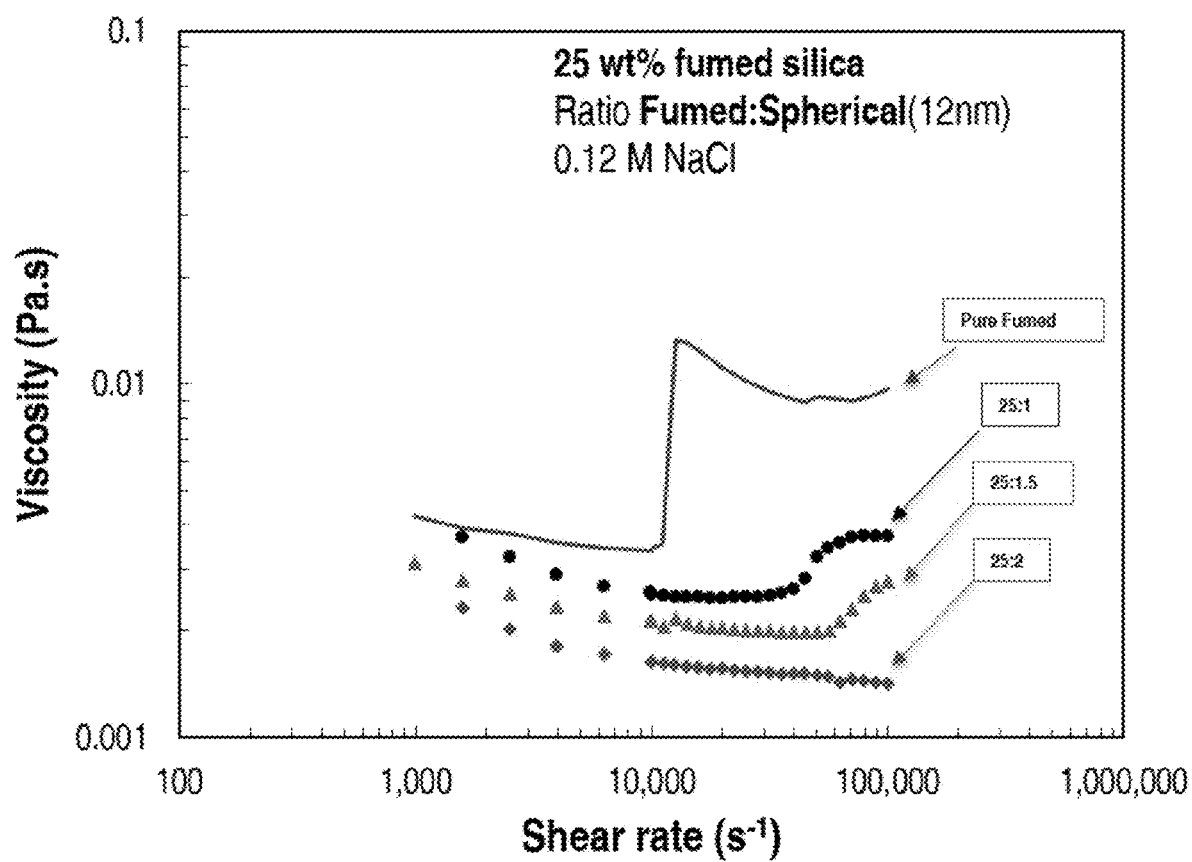
FIG. 17: Graph showing that mixing fumed and spherical silica particles alters thickening. The graph shows the viscosity as a function of shear rate for several slurries with varying fumed:spherical ratios, each having 25 wt % fumed silica, 12 nm spherical silica particles, and a salt concentration of 0.12 M NaCl. A pure fumed silica slurry is also shown for comparison.

FIG. 17 further shows that mixing fumed and spherical silica particles alters thickening. FIG. 17 shows the results of three different ratios of fumed:spherical silica particles, namely, 25:1, 25:1.5, and 25:2, still with a salt concentration of 0.12 M NaCl, a fumed silica concentration of 25 wt %, and 12 nm spherical silica particles. FIG. 17 also shows the pure fumed silica slurry for comparison. As seen from FIG. 17, the trend seen in FIG. 16 of decreasing viscosity at high shear rates with a decreasing ratio of fumed:spherical particles continued. The slurry with a fumed:spherical ratio of 25:2 exhibited the least thickening at high shear rates.

FIG. 18 further shows that mixing fumed and spherical silica particles alters thickening. FIG. 18 shows the results of various slurries using KCl as the salt instead of NaCl, still at a final concentration of 0.12 M. Each of the slurries had a 25 wt % total solids content. Spherical silica particles having a diameter of 12 nm were used. As seen in FIG. 18, the viscosity decreased at high shear rates as the ratio of fumed:spherical decreased.

Figure 19:
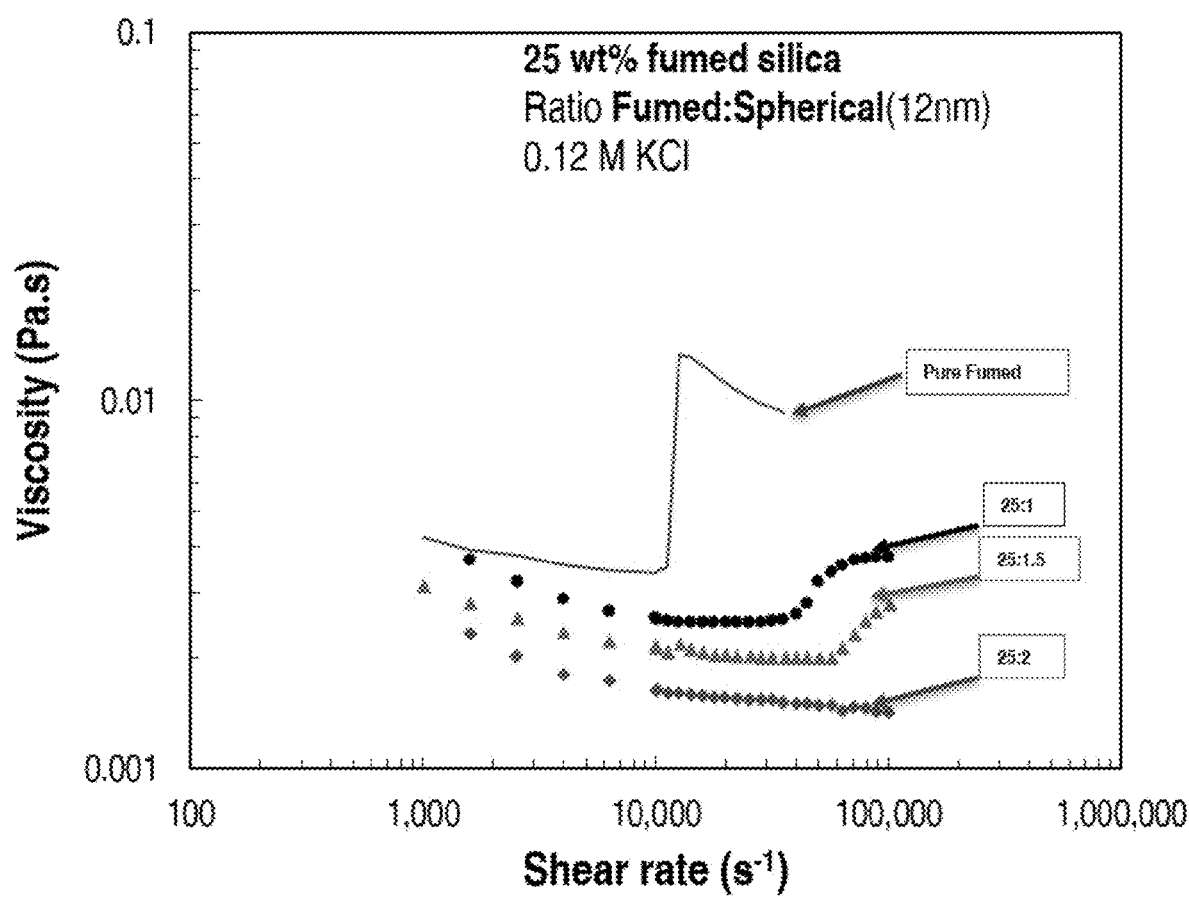
FIG. 19: Graph further showing that mixing fumed and spherical silica particles alters thickening. KCl was used as the salt. The graph shows the viscosity as a function of shear rate for several slurries with varying fumed:spherical ratios, each having 25 wt % fumed silica, 12 nm spherical silica particles, and a salt concentration of 0.12 M KCl. A pure fumed silica slurry is also shown for comparison.

FIG. 19 further shows that mixing fumed and spherical silica particles alters thickening, with KCl as the salt present in the slurries at a concentration of 0.12 M. The slurries shown in FIG. 19 had fumed silica at a concentration of 25 wt %, and the spherical silica particles used had a diameter of 12 nm. FIG. 19 again shows a decrease in viscosity at high shear rates corresponding with a decrease in the fumed: spherical ratio.

Figure 20:
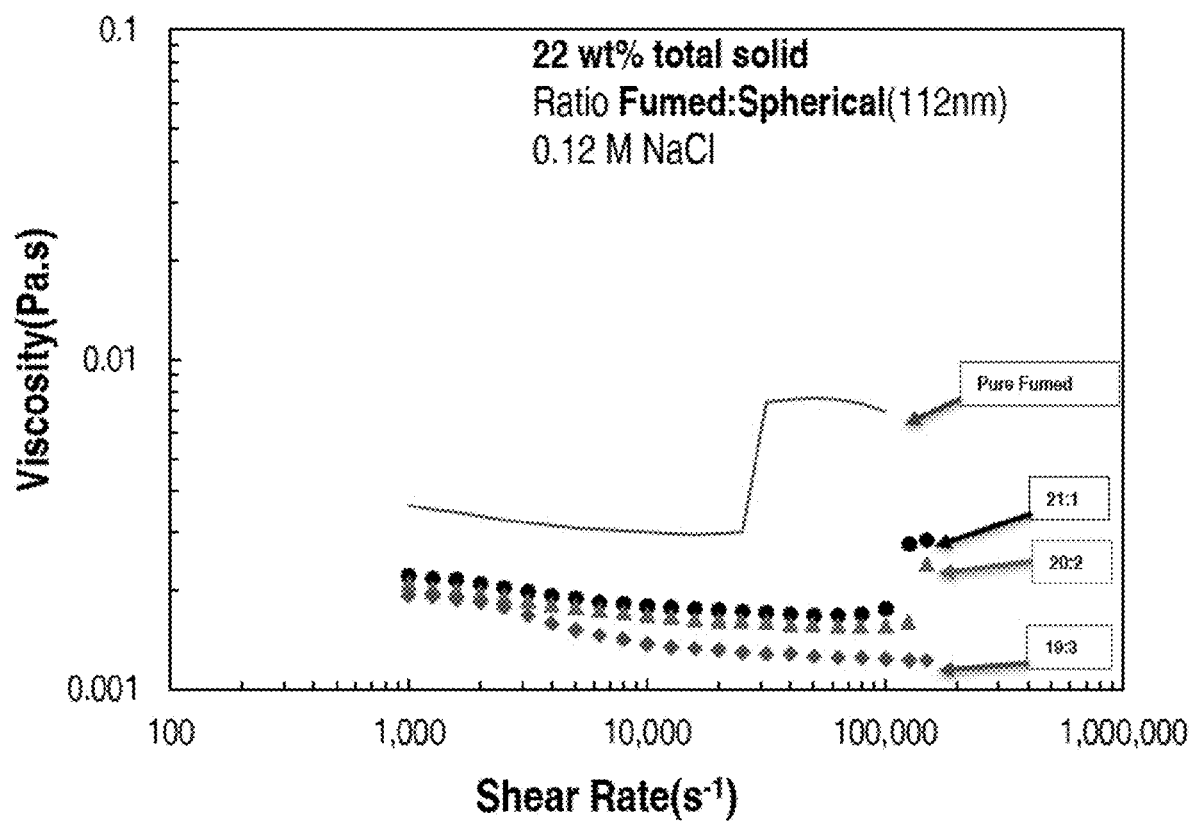
FIG. 20: Graph showing that mixing fumed and spherical silica particles alters thickening. The graph shows the viscosity as a function of shear rate for slurries having a total solids content of 22 wt %, a final salt concentration of 0.12 M NaCl, and spherical silica particles with a diameter of 112 nm, with varying fumed:spherical wt % ratios. A pure fumed silica slurry is also shown for comparison.

FIG. 20 further shows that mixing fumed and spherical particles alters thickening. Slurries having a total solids content of 22 wt %, a final salt concentration of 0.12 M NaCl, and spherical silica particles with a diameter of 112 nm, were evaluated. A pure fumed silica slurry is also shown for comparison. As seen from FIG. 20, decreasing the fumed:spherical ratio resulted in decreasing the viscosity at high shear rates. Thus, shear thickening was again lessened by increasing the amount of spherical silica particles in the fumed silica slurry. FIG. 20 shows that a 112 nm size of spherical silica particles is still capable of altering the thickening in this manner.

Figure 21:
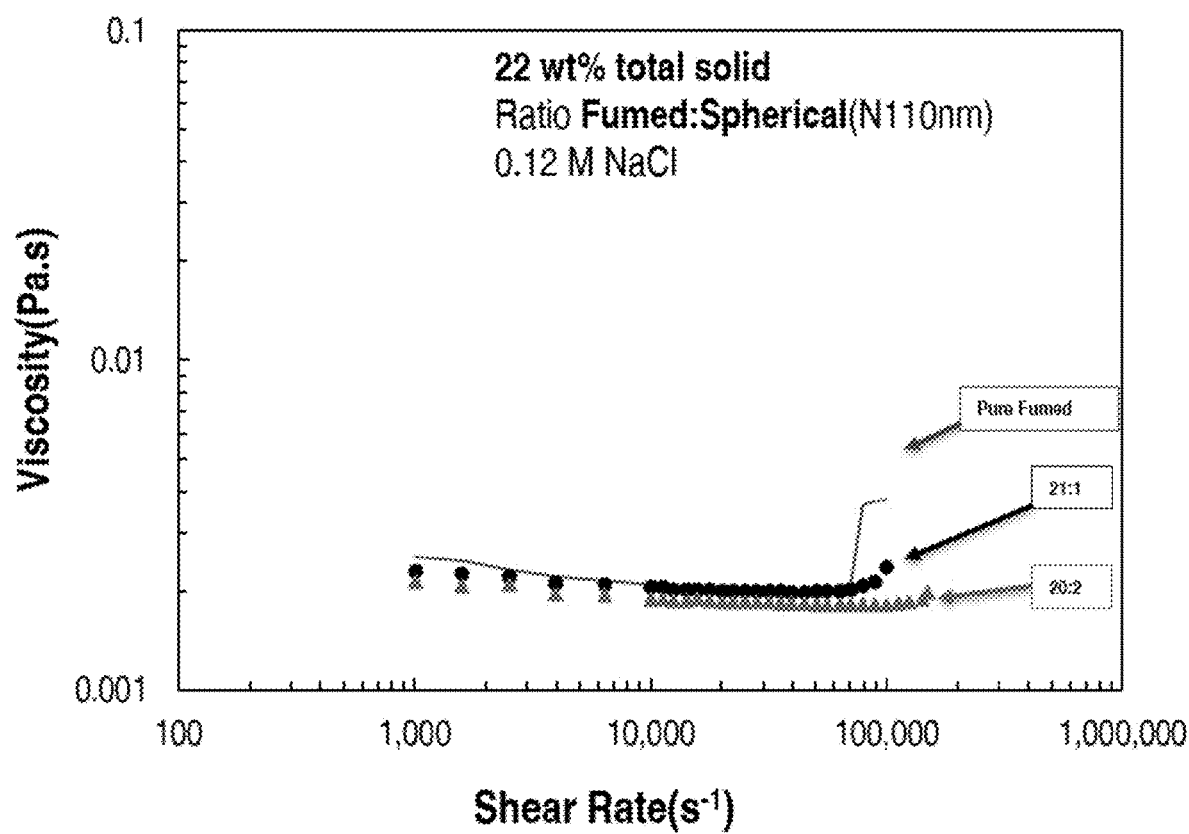
FIG. 21: Graph showing that mixing fumed and spherical silica particles alters thickening. The graph shows the viscosity as a function of shear rate for slurries having a total solids content of 22 wt %, a final salt concentration of 0.12 M NaCl, and spherical silica particles with a diameter of 110 nm, with varying fumed:spherical wt % ratios. A pure fumed silica slurry is also shown for comparison.

FIG. 21 further shows that mixing fumed and spherical particles alters thickening. Two slurries were prepared with a final salt concentration of 0.12 M NaCl, spherical particles having a diameter of 110 nm, and a total solids content of 22 wt %. FIG. 21 shows that decreasing the ratio of fumed: spherical resulted in decreasing viscosity at high shear rates.

Figure 22:
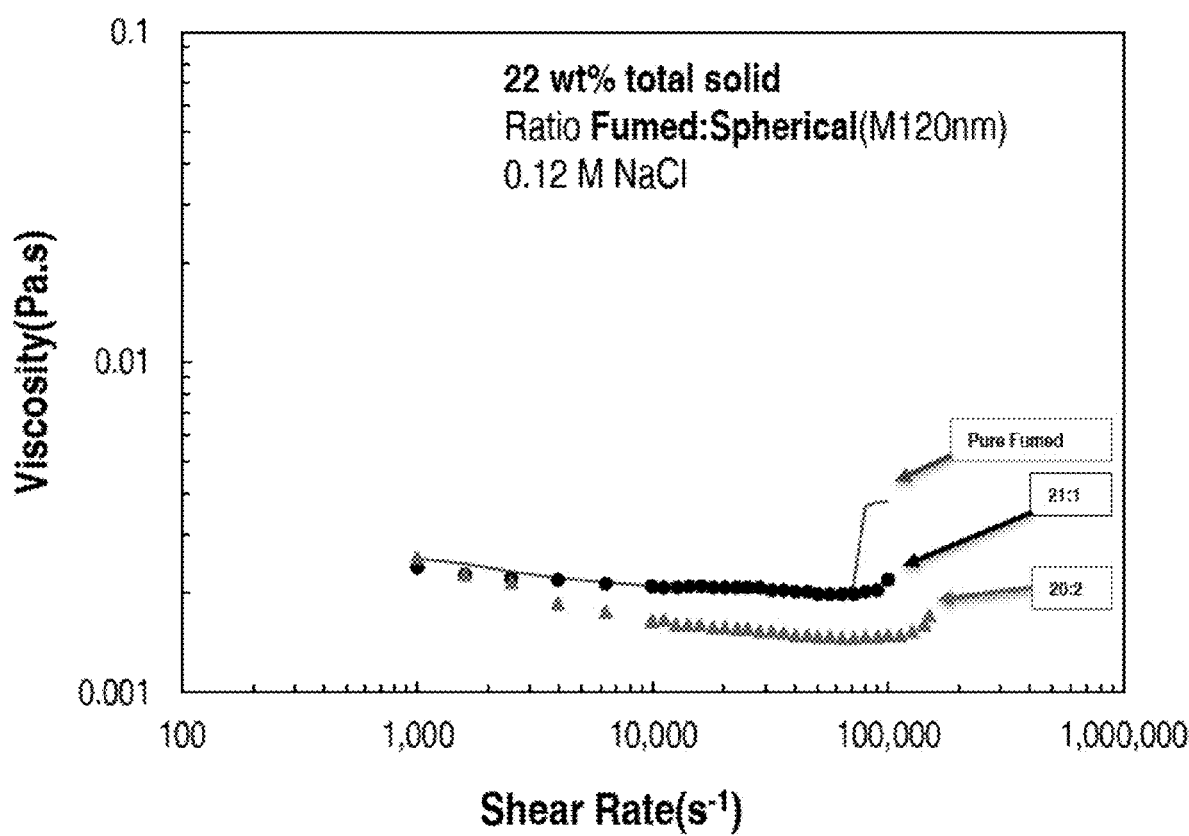
FIG. 22: Graph showing that mixing fumed and spherical particles alters thickening. The graph shows the viscosity as a function of shear rate for slurries having a total solids content of 22 wt %, spherical silica particles with a diameter of 120 nm, a salt concentration of 0.12 M NaCl, and varying fumed:spherical wt % ratios. A pure fumed silica slurry is also shown for comparison.

FIG. 22 further shows that mixing fumed and spherical particles alters thickening. Two slurries were prepared with 120 nm spherical silica particles, and a final salt concentration of 0.12 M NaCl. As seen in FIG. 22, thickening was reduced at high shear rates by decreasing the fumed:spherical ratio.

FIGS. 23A-23B show the impact of parent salt concentration on the thickening trend. A total of six slurries were prepared, three using a 1 M parent salt solution, and three using a 0.3 M salt solution. All of the slurries had a total silica content of 25 wt %, and a final salt concentration of 0.12 M. The salt used was NaCl. The spherical particles used had a diameter of 112 nm. Surprisingly, as seen in FIGS. 23A-23B, when a 1 M parent salt solution was used to prepare the slurries, the addition of spherical particles (i.e., a decrease in the fumed:spherical ratio) resulted in an increase, instead of a decrease, in the viscosity at high shear rates, whereas when a 0.3 M parent salt solution was used to prepare the slurries, the same trend as seen above was observed, where the addition of spherical particles reduced the viscosity at high shear rates. It is not currently known why this effect occurs.

Other parameters and concentrations were similarly evaluated. For example, a 2 M parent salt solution worked well to produce a homogeneous slurry having a salt concentration of 0.12 M that lessened thickening at high shear rates upon addition of spherical silica particles. The process was attempted with a 4 M parent salt solution, but the resulting slurry was heterogenous and unable to be tested. Furthermore, the process was attempted with 170 nm spherical silica particles, and the resulting composition successfully shifted the thickening as with the smaller size spherical silica particles.

Certain embodiments of the compositions and methods disclosed herein are defined in the above examples. It should be understood that these examples, while indicating particular embodiments of the invention, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A suspension comprising:
    a) a water-based mixture of:
        i) fumed silica particles, wherein the fumed silica particles are irregularly shaped clusters of fused spherical particles; and,
        ii) spherical silica particles; and
    b) a monovalent salt present in the suspension at a final salt concentration ranging from about 0.01 M to about 0.4 M.

2. The suspension of claim 1, wherein the monovalent salt has a final salt concentration ranging from about 0.02 M to about 0.25 M
    wherein the monovalent salt has a final salt concentration of about 0.12 M; or
    wherein the monovalent salt has a final salt concentration of about 0.18 M.

3. The suspension of claim 1, having a total solids content ranging from about 0.01 wt % to about 40 wt.

4. The suspension of claim 1, wherein the fumed silica particles and the spherical silica particles are present at a fumed:spherical wt % ratio ranging from about 18:7 to about 25:1.

5. The suspension of claim 1, wherein the spherical silica particles have a diameter ranging from about 10 nm to about 170 nm.

6. The suspension of claim 1, wherein the fumed silica particles have diameters ranging from about 100 nm to about 250 nm.

7. The suspension of claim 1, wherein the spherical silica particles are present in a concentration ranging from about 0.001 wt % to about 10 wt %.

8. The suspension of claim 1, wherein the suspension is prepared by contacting the mixture of the fumed silica particles and the spherical particles with a parent salt solution having a parent salt concentration ranging from about 0.15 M to about 3 M.

9. The suspension of claim 8, wherein:
    the parent salt solution has a parent salt concentration of about 0.3 M;
    the spherical silica particles have a diameter of about 112 nm;

whereby the suspension has a final salt concentration of about 0.12 M; and, the fumed silica particles and the spherical silica particles are present in a fumed:spherical wt % ratio ranging of about 24:1; or, the fumed silica particles and the spherical silica particles are present in a fumed:spherical wt % ratio ranging of about 23:2.

10. The suspension of claim 8, wherein:

the parent salt solution has a parent salt concentration of about 1 M, the spherical silica particles have a diameter of about 112 nm, whereby the suspension has a final salt concentration of about 0.12 M, and the fumed silica particles and the spherical silica particles are present in a fumed:spherical wt % ratio ranging of about 24:1; or, the fumed silica particles and the spherical silica particles are present in a fumed:spherical wt % ratio ranging of about 23:2.

11. The suspension of claim 1, wherein:

the spherical particles have a diameter of about 12 nm;

the monovalent salt has a final salt concentration of about 0.12 M; and, the fumed silica particles and the spherical silica particles are present a fumed:spherical wt % ratio of about 18.75:6.25; or, the fumed silica particles and the spherical silica particles are present a fumed:spherical wt % ratio of about 21.25:3.75; or, the fumed silica particles and the spherical silica particles are present a fumed:spherical wt % ratio of about 22.5:2.5; or, the fumed silica particles and the spherical silica particles are present a fumed:spherical wt % ratio of about 23.75:1.25;

the fumed silica particles and the spherical silica particles are present a fumed:spherical wt % ratio of about 24.5:0.5; or, the fumed silica particles and the spherical silica particles are present a fumed:spherical wt % ratio of about 25:2; or, the fumed silica particles and the spherical silica particles are present a fumed:spherical wt % ratio of about 25:1.5; or, the fumed silica particles and the spherical silica particles are present a fumed:spherical wt % ratio of about 25:1.

12. The suspension of claim 1, wherein:

the spherical particles have a diameter of about 112 nm;

the monovalent salt has a final salt concentration of about 0.12 M; and, the fumed silica particles and the spherical silica particles are present a fumed:spherical wt % ratio of about 19:3; or, the fumed silica particles and the spherical silica particles are present a fumed:spherical wt % ratio of about 20:2; or, the fumed silica particles and the spherical silica particles are present a fumed:spherical wt % ratio of about 21:1.

13. The suspension of claim 1, wherein:

the spherical particles have a diameter of about 110 nm;

the monovalent salt has a final salt concentration of about 0.12 M; and, the fumed silica particles and the spherical silica particles are present a fumed:spherical wt % ratio of about 20:2; or, the fumed silica particles and the spherical silica particles are present a fumed:spherical wt % ratio of about 21:1.

14. The suspension of claim 1, wherein:

the spherical particles have a diameter of about 120 nm;

the monovalent salt has a final salt concentration of about 0.12 M; and, the fumed silica particles and the spherical silica particles are present a fumed:spherical wt % ratio of about 20:2; or, the fumed silica particles and the spherical silica particles are present a fumed:spherical wt % ratio of about 21:1.

15. The suspension of claim 1, wherein the water-based mixture has a viscosity of about 1 cP at 25° C.

16. The suspension of claim 1, wherein the fumed silica particles have a size ranging from 100-250 nm at a concentration ranging from about 5 wt % to about 35 wt %, and the spherical silica particles have a size ranging from about 10 nm to about 150 nm at a concentration ranging from 0.001-10 wt %.

17. The suspension of claim 1, wherein the fumed silica and the spherical silica are present a fumed:spherical wt % ratio of from about 24:1 to about 23:2.

18. The suspension of claim 1, further comprising one or more additives selected from the group consisting of coagulants, emulsifiers, corrosion inhibitors, oxidizers, surfactants, chelating agents, and pH buffers.

19. The suspension of claim 1, further comprising a stabilizer.

20. The suspension of claim 1, wherein the monovalent salt has a final salt concentration ranging from about 0.1 M to about 0.2 M;

wherein the monovalent salt has a final salt concentration of about 0.12 M; or wherein the monovalent salt has a final salt concentration of about 0.18 M.

21. The suspension of claim 1, wherein the monovalent salt has a final salt concentration ranging from about 0.12 M to about 0.18 M;

wherein the monovalent salt has a final salt concentration of about 0.12 M; or wherein the monovalent salt has a final salt concentration of about 0.18 M.

22. The suspension of claim 1, having a total solids content ranging from about 15 wt % to about 30 wt %.

23. The suspension of claim 1, having a total solids content ranging from about 22 wt % to about 25 wt %.

24. The suspension of claim 1, wherein the spherical silica particles have a diameter of about 12 nm.

25. The suspension of claim 1, wherein the spherical silica particles have a diameter of about 112 nm.

26. The suspension of claim 1, wherein the suspension is prepared by contacting the mixture of the fumed silica particles and the spherical particles with a parent salt solution having a parent salt concentration ranging from about 0.3 M to about 1 M.

* * * * *